United States Patent
Peroulas et al.

(10) Patent No.: US 9,184,814 B2
(45) Date of Patent: Nov. 10, 2015

(54) METHOD FOR PRE-DISTORTING AND A PRE-DISTORTER

(75) Inventors: James Peroulas, San Mateo, CA (US); Feng Zeng, Shanghai (CN); Dongfang Ning, Shaanxi (CN); Zeliang Yang, Guangdong (CN); Yijun Duan, Shanghai (CN); Weiming Pan, Shanghai (CN); Zhengjian Dai, Shaanxi (CN); Aimin You, Guangdong (CN)

(73) Assignees: ZTE Corporation, Shenzhen (CN); ZTE Wistron Telecon AB, Stockholm (SE)

( * ) Notice: Subject to any disclaimer, the term of this patent is extended or adjusted under 35 U.S.C. 154(b) by 0 days.

(21) Appl. No.: 14/008,143

(22) PCT Filed: Mar. 28, 2011

(86) PCT No.: PCT/CN2011/072219
§ 371 (c)(1),
(2), (4) Date: Sep. 27, 2013

(87) PCT Pub. No.: WO2012/129768
PCT Pub. Date: Oct. 4, 2012

(65) Prior Publication Data
US 2014/0016725 A1 Jan. 16, 2014

(51) Int. Cl.
*H04B 7/04* (2006.01)
*H03F 1/32* (2006.01)
*H03F 3/189* (2006.01)
*H03F 3/24* (2006.01)

(52) U.S. Cl.
CPC ............ *H04B 7/0456* (2013.01); *H03F 1/3247* (2013.01); *H03F 1/3258* (2013.01); *H03F 3/189* (2013.01); *H03F 3/24* (2013.01)

(58) Field of Classification Search
CPC ........................................................ H04L 25/26
USPC ........................................ 375/295, 296, 297
See application file for complete search history.

(56) References Cited

U.S. PATENT DOCUMENTS

| | | | |
|---|---|---|---|
| 6,999,523 B2* | 2/2006 | Posti | 375/296 |
| 8,380,144 B1* | 2/2013 | Bai et al. | 455/114.3 |
| 2003/0053552 A1* | 3/2003 | Hongo et al. | 375/295 |
| 2004/0121741 A1 | 6/2004 | Rashev et al. | |
| 2004/0155707 A1 | 8/2004 | Kim et al. | |
| 2005/0162225 A1* | 7/2005 | Suzuki et al. | 330/149 |
| 2013/0094610 A1* | 4/2013 | Ghannouchi et al. | 375/296 |

FOREIGN PATENT DOCUMENTS

CN      1649258 A      8/2005

* cited by examiner

*Primary Examiner* — Jaison Joseph
(74) *Attorney, Agent, or Firm* — Dascenzo Intellectual Property Law, P.C.

(57) ABSTRACT

The document discloses a pre-distorter, which comprises: a pre-distortion module, which is configured to pre-distort a plurality of baseband input signals by an equal number of pre-distortion functions to obtain an equal number of pre-distorted signals respectively, wherein all of the baseband input signals input into every pre-distortion function, and each pre-distortion function has one output; an adder, which is configured to combine all of the pre-distorted signals output from every pre-distortion function into one combined signal; and a power amplifier (PA), which is configured to amplify the combined signal, wherein the cascade of the pre-distortion functions and the PA are linear overall. And the document also discloses a method for distorting. The document reduces the implementation cost of a pre-distorter.

18 Claims, 3 Drawing Sheets

METHOD FOR PRE-DISTORTING AND A PRE-DISTORTER

TECHNICAL FIELD

The document relates to the communication field, and particularly, to a method for pre-distorting and a pre-distorter.

BACKGROUND

Currently, if one wishes to transmit two signals with high efficiency over two different bands, the dual band digital pre-distortion (DB-DPD) system shown in FIG. 1 may be used. Complex baseband signals $BB_1$ 101 and $BB_2$ 102 are centered at 0 Hz and have a bandwidth of $B_1$ and $B_2$ respectively. The intent of the DB-DPD system is that $BB_1$ and $BB_2$ will appear on the power amplifier's output centered at frequencies $f_{c1}$ and $f_{c2}$ respectively.

Signals $BB_1$ 101 and $BB_2$ 102 are sent into frequency shifters 103 and 104 respectively, and the frequency shifters 103 and 104 shift the frequencies of the signals $BB_1$ 101 and $BB_2$ 102 to $f_1$ and $f_2$ respectively. These two shifted signals are combined by an adder 105 and then forwarded to a pre-distortion module 106, which processes the combined signal by a pre-distortion function. The output of the pre-distortion module 106 is then sent to a final frequency shifter 107 which shifts the frequency by $f_u$. It should be clear that $f_1+f_u=f_{c1}$ and $f_2+f_u=f_{c2}$. Also, $f_{c2}-f_{c1}=f_2-f_1$. In this application, a device which shifts the center frequency of a signal is called a 'frequency shifter'. Other equivalent terminology exists such as 'upconverter' and 'downconverter', but this application will use the term 'frequency shifter'.

The output of the final frequency shifter 107 is sent to a power amplifier (PA) 108, and the PA 108 produces the final signal which will be transmitted.

The power amplifier 108 is typically a low efficiency device and one method that can be used to improve its efficiency is to drive it into its nonlinear region. The problem is that the more the PA is driven into its nonlinear region, the higher the amount of distortion that is introduced by the PA.

The goal of the pre-distortion function, which is also a non-linear function, is to create a signal to be sent to the PA such that the output signal of the PA contains little or no distortion. In other words, although the pre-distortion function and the PA are individually non-linear, the cascade of the pre-distortion function and the PA produces a system that is linear overall.

Although many functions can be used for the pre-distortion function, one function that is often used is called the memory polynomial, which is shown in Eq 1:

$$\text{pd\_out}(n) = \sum_{j=0}^{M-1} \sum_{k=0}^{L-1} h_{j,k} \text{pd\_in}(n-j) |\text{pd\_in}(n-j)|^k. \quad \text{Eq 1}$$

Wherein pd_in is the signal input into the pre-distortion function and pd_out is the signal produced by the pre-distortion function, n is the sample index, and M and L represent the memory depth and nonlinearity length of the above example of a pre-distortion function, respectively. The actual values used for M and L will vary based on the actual PA that is being used but typically, M will be a rather small number around 4 and L will be around 10.

One method that can be used to calculate the coefficients $h_{j,k}$ is the indirect learning architecture. The concept of the indirect learning architecture is that a model, which models the input of the PA based on the output of the PA, is created. Once such a model is created, the model is used directly as the pre-distortion function.

For example, suppose that several samples input into and output from the PA are captured and are denoted as $p_i$ for the samples input into the PA, and $p_o$ for the samples output from the PA. The required number of samples varies from one PA to another PA but typically, the required number of samples is between 2000 and 10000.

These samples are typically observed using a capture buffer 111. The capture buffer 111 has two inputs. One input of the capture buffer 111 comes from the output of the pre-distortion module 106. The other input of the capture buffer 111 first comes from a coupler 110 which extracts a small portion (typically less than 1% of the output power) of the signal coming from the PA. The most important property of the coupler is that it produces a signal that very accurately represents the actual output of the PA, but at a significantly reduced power level. This extracted signal is forwarded to a frequency shifter 109 which shifts the signal back down in frequency by $f_u$. The output of this frequency shifter 109 is connected to the other input of the capture buffer 111.

The capture buffer 111 is typically controlled by a Digital Signal Processor (DSP) 112 which, through the use of a trigger signal, indicates when the capture buffer 111 should begin capturing data. Once the capture buffer 111 receives a trigger signal, it begins to capture data until the memory of the capture buffer 111 has been completely filled.

After the capture buffer's memory has been filled, the captured values for $p_i$ and $p_o$ are typically read out of the capture buffer 111 by a Digital Signal Processor (DSP) 112 which proceeds to solve for the coefficients $\hat{h}_{j,k}$ in the following equation Eq 2 using least squares minimization.

$$p_i(n) = \sum_{j=0}^{M-1} \sum_{k=0}^{L-1} \hat{h}_{j,k} p_o(n-j) |p_o(n-j)|^k. \quad \text{Eq 2}$$

Specifically, the above equation Eq 2 can be expressed using matrix arithmetic as Eq 3:

$$\vec{p}_i = H\vec{h}. \quad \text{Eq 3}$$

Wherein the $\vec{p}_i$, H, and $\vec{h}$ in Eq 3 can be expressed as Eq 4, Eq 5, and Eq 6 respectively:

$$\vec{p}_i = \begin{bmatrix} p_i(1) \\ p_i(2) \\ \ldots \end{bmatrix} \quad \text{Eq 4}$$

$$H = \begin{bmatrix} p_o(1) & \ldots & p_o(1)|p_o(1)|^L & \ldots & p_o(1-M) & \ldots & p_o(1-M)|p_o(1-M)|^L \\ p_o(2) & \ldots & p_o(2)|p_o(2)|^L & \ldots & p_o(2-M) & \ldots & p_o(2-M)|p_o(2-M)|^L \\ \ldots & \ldots & \ldots & \ldots & \ldots & \ldots & \ldots \end{bmatrix} \quad \text{Eq 5}$$

$$\vec{h} = \begin{bmatrix} \hat{h}_{0,0} \\ \ldots \\ \hat{h}_{0,L} \\ \ldots \\ \hat{h}_{M,0} \\ \ldots \\ \hat{h}_{M,L} \end{bmatrix}.$$

Eq 6

The least squares minimization solution to the overdetermined equation Eq 3 is expressed as Eq 7:

$$\vec{h} = (H^H H)^{-1} H^H \vec{p}_i.$$

Eq 7

The general operation of the DB-DPD system shown in FIG. 1 is that when the DB-DPD system is first turned on, $h_{0,0}$ will be 1 and all other values of $h_{j,k}$ will be zero. Some data will be captured by the capture buffer 111 and analyzed by the DSP 112 so as to produce the vector $\vec{h}$ and all of the values of $\hat{h}_{j,k}$. After these values have been calculated, all of the $h_{j,k}$ values will be simultaneously updated and replaced with the $\hat{h}_{j,k}$ values. One can consider the $h_{j,k}$ values to be the 'old values' or the 'current values' which are updated all at once with the $\hat{h}_{j,k}$ values which can be considered the 'new values' or the 'updated values'.

The process of capturing data, performing calculations, and finally updating the coefficients $h_{j,k}$ can be considered as one iteration. Typically, several iterations are performed so as to reach a final optimal solution. Also, if it is known that the characteristics of the PA will be changing in time, iterations may be performed continuously.

As shown in FIG. 2, the bandwidth of the signal input into the pre-distortion function is expressed as Eq 8 or Eq 9:

$$B_{PD,in} = f_{c_2} - f_{c_1} + \frac{B_1}{2} + \frac{B_2}{2}$$

Eq 8

$$B_{PD,in} = B_1 + B_2 + B_{deadspace}.$$

Eq 9

Wherein the $B_{deadspace}$ is the amount of unused bandwidth between signals $BB_1$ and $BB_2$, which is expressed as Eq 10:

$$B_{deadspace} = f_{c_2} - f_{c_1} - \frac{B_1}{2} - \frac{B_2}{2}.$$

Eq 10

It is well known to a person skilled in the art that the bandwidth of the signal output from the pre-distortion module 106 is significantly larger than the bandwidth $B_{PD,in}$ of the signal input into the pre-distortion module 106. The actual bandwidth required on the output of the pre-distortion module 106 so as to sufficiently linearize the PA 108 depends on the actual PA 108 in use, the center frequency of the PA 108, and the actual signal being transmitted through the PA 108. However, a general rule of thumb is that the bandwidth of the signal output from the pre-distortion module 106 must be about 5 to 7 times the bandwidth of the signal input into the pre-distortion module 106. Although the bandwidth expansion factor of the pre-distortion module 106 will vary based on the particular application, for the discussion in this application, the bandwidth expansion factor will be assumed to be 7. Thus the bandwidth $B_{PD,out}$ of the signal output from the pre-distortion module is expressed in Eq 11:

$$B_{PD,out} = 7 B_{PD,in}.$$

Eq 11

The pre-distortion module will produce output samples at a sampling rate of at least $B_{PD,out}$. Thus, the larger $B_{PD,in}$ is, the more stringent the requirements on the pre-distortion function are. Specifically, the sampling rate of the output of the pre-distortion module, and the minimum rate at which the pre-distortion module must calculate output samples, is:

$$f_{s,PDout} = 7 B_{PD,in} = 7(B_1 + B_2 + B_{deadspace}).$$

Eq 12

Thus, although the final signal to be transmitted from the PA only contains energy over a frequency range totaling $B_1 + B_2$, the sampling rate of the pre-distortion module is severely degraded by $B_{deadspace}$. For example, suppose that $B_1$ and $B_2$ are 5 MHz and 10 MHz respectively and suppose further that $B_{deadspace}$ is 200 MHz. Although only 15 MHz of information will be transmitted by the PA, the output of the pre-distortion module will need to run at a frequency of about 1.5 GHz!

Note that typically, the sampling rate of the data input into the pre-distortion module will be equal to the sampling rate of the data output from the pre-distortion function:

$$f_{s,PDout} = f_{s,PDin}$$

Eq 13

Furthermore, the sampling rate of all the processing before the pre-distortion function will also typically be at the same rate as $f_{s,PDin}$.

It can be seen from the above description that the minimum sampling rate required by the related art is expressed in Eq 14:

$$f_{s,min\_prior\_art} = 7(B_1 + B_2 + B_{deadspace})$$

Eq 14

And the implementation cost of the related art is related to $f_{s,min\_prior\_art}$. The larger $f_{s,min\_prior\_art}$ is, the larger the implementation cost is.

Thus, the implementation cost of the related art depends on $B_{deadspace}$ and can become immense if $B_{deadspace}$ is very large. It would be beneficial if a solution existed to reduce the implementation cost of a dual band pre-distortion transmitter. Furthermore, it would also be beneficial if a solution existed such that the implementation cost of a dual band pre-distortion transmitter would not be a function of $B_{deadspace}$.

SUMMARY

The problem to be solved in the document is to provide a method for pre-distorting and a pre-distorter, which reduces the implementation cost of a pre-distortion transmitter.

In order to solve the above technical problem, the document provides a pre-distorter, which comprises:

a pre-distortion module, which is configured to pre-distort a plurality of baseband input signals by an equal number of pre-distortion functions to obtain an equal number of pre-distorted signals respectively, wherein all of the baseband input signals input into every pre-distortion function, and each pre-distortion function has one output;

an adder, which is configured to combine all of the pre-distorted signals output from every pre-distortion function into one combined signal; and a power amplifier (PA), which is configured to amplify the combined signal, wherein the cascade of the pre-distortion functions and the PA are linear overall.

Wherein the pre-distortion module is a multiple input multiple output (MIMO) pre-distortion module, wherein the number of inputs and outputs of the pre-distortion module are equal to the number of baseband input signals, and each output corresponds to one pre-distortion function;

or the pre-distortion module includes a plurality of pre-distortion units, wherein all of the baseband input signals input into each pre-distortion unit, and each pre-distortion unit corresponds to one pre-distortion function and has one output.

The pre-distorter further comprises:

a frequency shifting module, which is configured to frequency shift the output of each pre-distortion function, wherein a center frequency of the output of each pre-distortion function is shifted to a transmitting carrier frequency.

Wherein the frequency shifting module comprises a plurality of frequency shifters, wherein each output of the pre-distortion module is connected to one or more cascaded frequency shifters, and all frequency shifters shift the center frequency of the output of each pre-distortion function to a transmitting carrier frequency finally;

or each output of the pre-distortion module is connected to one or more cascaded frequency shifters, which shift the center frequency of the output of each pre-distortion function to an intermediary frequency finally, and the outputs of the frequency shifters are connected to the adder, and the output of the adder connects one or more cascaded frequency shifters, which shift the center frequency of the output of the adder to transmitting carrier frequencies; or each output of the pre-distortion module is connected to one or more cascaded frequency shifters, which shift the center frequency of the output of each pre-distortion function to an intermediary frequency finally, and the outputs of the frequency shifters are connected to the adder, and the output of the adder is connected to one or more cascaded frequency shifters, which shift the center frequency of the output of the adder to transmitting carrier frequencies; or F outputs of the pre-distortion module are connected to one or more cascaded frequency shifters, which shift the center frequency of the output of the pre-distortion function to an intermediary frequency finally, F equal to the number of baseband input signals minus 1, and the outputs of the frequency shifters are connected to the adder, and output of the adder is connected to one or more cascaded frequency shifters, which shift the center frequency of the output of the adder to transmitting carrier frequencies.

The pre-distorter further comprises:

a bandpass filter, which is configured to connect with an output of the PA, and filter out harmonics of said carrier frequencies introduced by the PA, and transmit the filtered signal;

wherein the cascade of the pre-distortion functions, the PA and the bandpass filter are linear overall.

Wherein the pre-distortion functions are $$PD_i(n) = \sum_{j=0}^{M_i-1}\sum_{k_1=0}^{L_{i,1}-1}\sum_{k_2=0}^{L_{i,2}-1} \ldots \sum_{k_N=0}^{L_{i,N}-1} h_{i,j,k_1,k_2,\ldots,k_N} BB_i(n-j)$$

$$|BB_1(n-j)|^{k_1}|BB_2(n-j)|^{k_2} \ldots |BB_N(n-j)|^{k_N}$$

Wherein i is between 1 and N, and N is equal to the number of the baseband input signals;

$M_i$ represents the memory depth of the PA, $L_{i,1}, L_{i,2}, \ldots, L_{i,N}$ represent the nonlinearity length and the interband cross-correlation degree of the pre-distortion function, and values used form $M_i$, $L_{i,1}, L_{i,2}, \ldots,$ and $L_{i,N}$ vary based on the PA;

coefficients $h_{i,j,k_1,k_2,\ldots,k_N}$ are chosen such that the cascade of the MIMO pre-distortion function, and the PA will be linear overall;

$BB_1$ are baseband input signals, and $PD_i$ are the pre-distorted signals.

Wherein the coefficients $h_{i,j,k_1,k_2,\ldots,k_N}$ are obtained by solving:

$$PD_i(n) = \sum_{j=0}^{M_i-1}\sum_{k_1=0}^{L_{i,1}-1}\sum_{k_2=0}^{L_{i,2}-1} \ldots \sum_{k_N=0}^{L_{i,N}-1} \hat{h}_{i,j,k_1,k_2,\ldots,k_N} PO_i(n-j)$$

$$|PO_1(n-j)|^{k_1}|PO_2(n-j)|^{k_2} \ldots |PO_N(n-j)|^{k_N}$$

wherein $PO_i$ are captured signals of the pre-distorted signals, which are captured from the output of the PA.

The pre-distorter further comprises:

a plurality of bandpass filters, which are configured to filter a signal output from the PA, wherein the number of the bandpass filters is equal to the number of the baseband input signals;

a plurality of frequency shifters, which are configured to shift the output signals of each bandpass filter respectively to obtain captured signals $PO_i$, wherein the center frequency of each frequency shifted signal is zero, and the number of the bandpass filters is equal to the number of the baseband input signals;

a capture buffer, which is configured to obtain $PD_i$ and $PO_i$, and output the obtained $PD_i$ and $PO_i$ to a digital data processor (DSP), and the number of inputs of the capture buffer equals to twice of the number of the baseband input signals; and a DSP, which is configured to calculate coefficients $h_{i,j,k_1,k_2,\ldots,k_N}$ by solving equation Eq.2, and output the calculated coefficients $h_{i,j,k_1,k_2,\ldots,k_N}$ to the pre-distortion module.

9. The pre-distorter as claimed in claim 8, wherein the DSP is configured to use least squares minimization $\vec{h}_i = (H_i^H H_i)^{-1} H_i^H \vec{p}_{di}$ to solve the above equation to obtain the values of $\hat{h}_{i,j,k_1,k_2,\ldots,k_N}$, wherein $$\vec{p}_{di} = \begin{bmatrix} PD_i(1) \\ PD_i(2) \\ \ldots \end{bmatrix},$$

$$\vec{h}_i = \begin{bmatrix} \hat{h}_{i,0,0,\ldots,0,0} \\ \ldots \\ \hat{h}_{i,0,0,\ldots,0,L_{i,N}-1} \\ \hat{h}_{i,0,0,\ldots,1,0} \\ \ldots \\ \hat{h}_{i,0,0,\ldots,1,L_{i,N}-1} \\ \ldots \\ \hat{h}_{i,0,0,\ldots,L_{i,N-1}-1,0} \\ \ldots \\ \hat{h}_{i,0,0,\ldots,L_{i,N-1}-1,L_{i,N}-1} \\ \ldots \\ \hat{h}_{i,1,0,\ldots,0,0} \\ \ldots \\ \hat{h}_{i,M_i-1,L_{i,1}-1,\ldots,L_{i,N-1}-1,L_{i,N}-1} \end{bmatrix},$$

$H_i$ is a matrix, and elements in the matrix are expressed as $PO_i(n-j)|PO_i(n-j)|^{k_1}|PO_1(n-j)|^{k_2} \ldots |PO_i(n-j)|^{k_i} \ldots |PO_N(n-j)|^{k_N}$, and row n in the matrix is expressed as:

$$\begin{bmatrix} PO_i(n-0)|PO_1(n-0)|^0|PO_2(n-0)|^0 \ldots |PO_{N-1}(n-0)|^0|PO_N(n-0)|^0 \\ PO_i(n-0)|PO_1(n-0)|^0|PO_2(n-0)|^0 \ldots |PO_{N-1}(n-0)|^0|PO_N(n-0)|^1 \\ \ldots \\ PO_i(n-0)|PO_1(n-0)|^0|PO_2(n-0)|^0 \ldots |PO_{N-1}(n-0)|^0|PO_N(n-0)|^{L_{i,N}-1} \\ PO_i(n-0)|PO_1(n-0)|^0|PO_2(n-0)|^0 \ldots |PO_{N-1}(n-0)|^1|PO_N(n-0)|^0 \\ PO_i(n-0)|PO_1(n-0)|^0|PO_2(n-0)|^0 \ldots |PO_{N-1}(n-0)|^1|PO_N(n-0)|^1 \\ \ldots \\ PO_i(n-0)|PO_1(n-0)|^0|PO_2(n-0)|^0 \ldots |PO_{N-1}(n-0)|^1|PO_N(n-0)|^{L_{i,N}-1} \\ PO_i(n-0)|PO_1(n-0)|^0|PO_2(n-0)|^0 \ldots |PO_{N-1}(n-0)|^2|PO_N(n-0)|^0 \\ PO_i(n-0)|PO_1(n-0)|^0|PO_2(n-0)|^0 \ldots |PO_{N-1}(n-0)|^2|PO_N(n-0)|^1 \\ \ldots \\ PO_i(n-0)|PO_1(n-0)|^{L_{i,1}-1}|PO_2(n-0)|^{L_{i,2}-1} \ldots |PO_{N-1}(n-0)|^{L_{i,N-1}-1}|PO_N(n-0)|^{L_{i,N}-1} \\ PO_i(n-1)|PO_1(n-1)|^0|PO_2(n-1)|^0 \ldots |PO_{N-1}(n-1)|^0|PO_N(n-1)|^0 \\ \ldots \\ PO_i(n-1)|PO_1(n-1)|^{L_{i,1}-1}|PO_2(n-1)|^{L_{i,2}-1} \ldots |PO_{N-1}(n-1)|^{L_{i,N-1}-1}|PO_N(n-1)|^{L_{i,N}-1} \\ PO_i(n-2)|PO_1(n-2)|^0|PO_2(n-2)|^0 \ldots |PO_{N-1}(n-2)|^0|PO_N(n-2)|^0 \\ \ldots \\ PO_i(n-M_i)|PO_1(n-M_i)|^{L_{i,1}-1}|PO_2(n-M_i)|^{L_{i,2}-1} \ldots |PO_{N-1}(n-M_i)|^{L_{i,N-1}-1}|PO_N(n-M_i)|^{L_{i,N}-1} \end{bmatrix}^T$$

In order to solve the above technical problem, the document also provides a method for pre-distorting, the method comprising:

a plurality of baseband input signals being pre-distorted by an equal number of pre-distortion functions to obtain an equal number of pre-distorted signals respectively, wherein all of the baseband input signals input into every pre-distortion function, and each pre-distortion function has one output;

the pre-distorted signals being combined into one signal;

the combined signal being amplified by a power amplifier (PA), wherein the cascade of the pre-distortion functions and the PA are linear overall.

After the step of a plurality of baseband input signals being pre-distorted by an equal number of pre-distortion functions, the method further comprising:

the pre-distorted signal of each pre-distortion function being frequency shifting, wherein a center frequency of the pre-distorted signal of each pre-distortion function is shifted to a transmitting carrier frequency.

After the step of the combined signal being power amplified by a PA, the method further comprising:

the output signal of the PA passing through a bandpass filter which filters out harmonics of said carrier frequencies introduced by the PA, and the bandpass filter transmitting the filtered signal;

wherein the cascade of the pre-distortion functions, the PA and the bandpass filter are linear overall.

Wherein in the step of a plurality of baseband input signals being pre-distorted by an equal number of pre-distortion functions, the pre-distortion functions are $$PD_i(n) = \sum_{j=0}^{M_i-1} \sum_{k_1=0}^{L_{i,1}-1} \sum_{k_2=0}^{L_{i,2}-1} \ldots \sum_{k_N=0}^{L_{i,N}-1} h_{i,j,k_1,k_2,\ldots,k_N} BB_i(n-j)$$

$$|BB_1(n-j)|^{k_1}|BB_2(n-j)|^{k_2} \ldots |BB_N(n-j)|^{k_N}$$

Wherein i is between 1 and N, and N is equal to the number of the baseband input signals;

$M_i$ represents the memory depth of the PA, $L_{i,1}, L_{i,2}, \ldots, L_{i,N}$ represent the nonlinearity length and the interband cross-correlation degree of the pre-distortion function, and values used for $M_i, L_{i,1}, L_{i,2}, \ldots,$ and $L_{i,N}$ vary based on the PA;

coefficients $h_{i,j,k_1,k_2,\ldots,k_N}$ are chosen such that the cascade of the MIMO pre-distortion function, and the PA will be linear overall;

$BB_1$ are baseband input signals, and $PD_i$ are the pre-distorted signals.

Wherein the coefficients $h_{i,j,k_1,k_2,\ldots,k_N}$ are obtained by solving:

$$PD_i(n) = \sum_{j=0}^{M_i-1} \sum_{k_1=0}^{L_{i,1}-1} \sum_{k_2=0}^{L_{i,2}-1} \ldots \sum_{k_N=0}^{L_{i,N}-1} \hat{h}_{i,j,k_1,k_2,\ldots,k_N} PO_i(n-j)$$

$$|PO_1(n-j)|^{k_1}|PO_2(n-j)|^{k_2} \ldots |PO_N(n-j)|^{k_N}$$

wherein $PO_i$ are captured signals of the pre-distorted signals, which are captured from the output of the PA.

Wherein a way of obtaining the captured signals of the pre-distorted signals comprises:

a plurality of bandpass filters filtering a signal output from the PA, wherein the number of the bandpass filters is equal to the number of the baseband input signals; and frequency shifting the output signals of each bandpass filter respectively to obtain captured signals $PO_i$, wherein the center frequency of each frequency shifted signal is zero.

Wherein least squares minimization $\vec{\hat{h}}_i = (H_i^H H_i)^{-1} H_i^H \vec{p}_{di}$ are used to solve the EQ. 4 to obtain the values of $\hat{h}_{i,j,k_1,k_2,\ldots,k_N}$.

wherein $$\vec{p}_{di} = \begin{bmatrix} PD_i(1) \\ PD_i(2) \\ \ldots \end{bmatrix},$$

$$\vec{h}_i = \begin{bmatrix} \hat{h}_{i,0,0,\ldots,0,0} \\ \ldots \\ \hat{h}_{i,0,0,\ldots,0,L_{i,N}-1} \\ \hat{h}_{i,0,0,\ldots,1,0} \\ \ldots \\ \hat{h}_{i,0,0,\ldots,1,L_{i,N}-1} \\ \ldots \\ \hat{h}_{i,0,0,\ldots,L_{i,N-1}-1,0} \\ \ldots \\ \hat{h}_{i,0,0,\ldots,L_{i,N-1}-1,L_{i,N}-1} \\ \ldots \\ \hat{h}_{i,1,0,\ldots,0,0} \\ \ldots \\ \hat{h}_{i,M_i-1,L_{i,1}-1,\ldots,L_{i,N-1}-1,L_{i,N}-1} \end{bmatrix},$$

$H_i$ is a matrix, and elements in the matrix are expressed as $PO_i(n-j)|PO_i(n-j)|^{k_1}|PO_1(n-j)|^{k_2}\ldots|PO_i(n-j)|^{k_i}\ldots|PO_N(n-j)|^{k_N}$, and row n in the matrix is expressed as:

$$\begin{bmatrix} PO_i(n-0)|PO_1(n-0)|^0|PO_2(n-0)|^0 \ldots |PO_{N-1}(n-0)|^0|PO_N(n-0)|^0 \\ PO_i(n-0)|PO_1(n-0)|^0|PO_2(n-0)|^0 \ldots |PO_{N-1}(n-0)|^0|PO_N(n-0)|^1 \\ \ldots \\ PO_i(n-0)|PO_1(n-0)|^0|PO_2(n-0)|^0 \ldots |PO_{N-1}(n-0)|^0|PO_N(n-0)|^{L_{i,N}-1} \\ PO_i(n-0)|PO_1(n-0)|^0|PO_2(n-0)|^0 \ldots |PO_{N-1}(n-0)|^1|PO_N(n-0)|^0 \\ PO_i(n-0)|PO_1(n-0)|^0|PO_2(n-0)|^0 \ldots |PO_{N-1}(n-0)|^1|PO_N(n-0)|^1 \\ \ldots \\ PO_i(n-0)|PO_1(n-0)|^0|PO_2(n-0)|^0 \ldots |PO_{N-1}(n-0)|^1|PO_N(n-0)|^{L_{i,N}-1} \\ PO_i(n-0)|PO_1(n-0)|^0|PO_2(n-0)|^0 \ldots |PO_{N-1}(n-0)|^2|PO_N(n-0)|^0 \\ PO_i(n-0)|PO_1(n-0)|^0|PO_2(n-0)|^0 \ldots |PO_{N-1}(n-0)|^2|PO_N(n-0)|^1 \\ \ldots \\ PO_i(n-0)|PO_1(n-0)|^{L_{i,1}-1}|PO_2(n-0)|^{L_{i,2}-1} \ldots |PO_{N-1}(n-0)|^{L_{i,N-1}-1}|PO_N(n-0)|^{L_{i,N}-1} \\ PO_i(n-1)|PO_1(n-1)|^0|PO_2(n-1)|^0 \ldots |PO_{N-1}(n-1)|^0|PO_N(n-1)|^0 \\ \ldots \\ PO_i(n-1)|PO_1(n-1)|^{L_{i,1}-1}|PO_2(n-1)|^{L_{i,2}-1} \ldots |PO_{N-1}(n-1)|^{L_{i,N-1}-1}|PO_N(n-1)|^{L_{i,N}-1} \\ PO_i(n-2)|PO_1(n-2)|^0|PO_2(n-2)|^0 \ldots |PO_{N-1}(n-2)|^0|PO_N(n-2)|^0 \\ \ldots \\ PO_i(n-M_i)|PO_1(n-M_i)|^{L_{i,1}-1}|PO_2(n-M_i)|^{L_{i,2}-1} \ldots |PO_{N-1}(n-M_i)|^{L_{i,N-1}-1}|PO_N(n-M_i)|^{L_{i,N}-1} \end{bmatrix}^T.$$

Wherein in the step of a plurality of baseband input signals being pre-distorted by an equal number of pre-distortion functions, initially, $h_{i,0,0,0,\ldots,0}$ are set to 1 and all other values for $h_{i,j,k_1,k_2,\ldots,k_N}$ are set to zero; and when coefficients $h_{i,j,k_1,k_2,\ldots,k_N}$ are obtained by solving the above equation, the method further comprises: updating with the obtained $h_{i,j,k_1,k_2,\ldots,k_N}$.

The method further comprises:
recalculating coefficients $h_{i,j,k_1,k_2,\ldots,k_N}$ by solving equation Eq. 4 at a plurality of times or at a period; and
updating old coefficients $h_{i,j,k_1,k_2,\ldots,k_N}$ with the recalculated coefficients $h_{i,j,k_1,k_2,\ldots,k_N}$.

The document pre-distorts the complex baseband signals input into the multiband pre-distorter instead of pre-distorting a frequency shifted signal, so the sampling rate of the document does not depend on $B_{deadspace}$ at all. This means that regardless of whether the two bands are separated by 100 MHz or 1 GHz, the implementation cost of the document remains constant. Therefore, the document reduces the implementation cost of a pre-distorter, and the implementation cost in the document does not depend on $B_{deadspace}$.

PREFERRED EMBODIMENTS OF THE DOCUMENT

Figure 1:
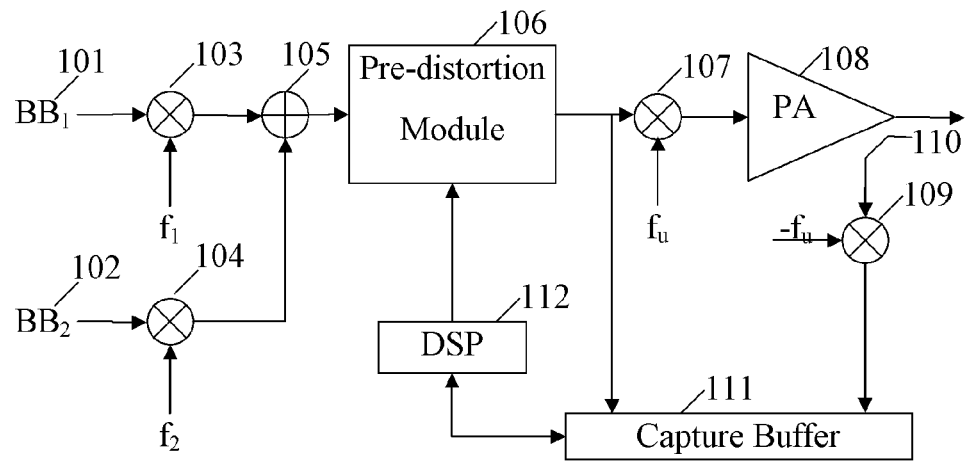
FIG. 1 is a sketch map of a Dual band digital pre-distortion system in the related art.
Figure 2:
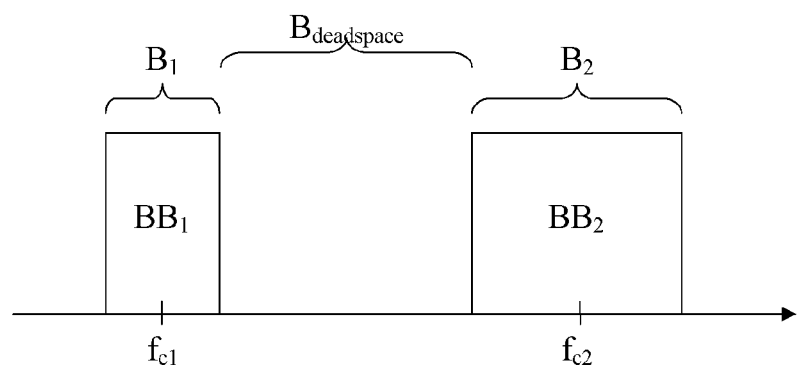
FIG. 2 is a figure for visual description of the occupied bandwidth.

The main technical scheme of the document is: A plurality of baseband input signals is pre-distorted by an equal number of pre-distortion functions respectively, wherein all of the baseband input signals are input into each pre-distortion function, and each pre-distortion function has one output; the pre-distorted signals are combined into one signal; the combined signal is then power amplified by a PA, and then the PA transmits the processed signal, wherein the cascade of the pre-distortion function and the PA are linear overall, wherein the number of the pre-distortion functions is equal to the number of the baseband input signals.

The disclosure will describe the examples of the document with reference to figures. It should be noted that the examples and the features of the examples can be combined arbitrarily without a conflict.

One example of the document provides a pre-distorter, which comprises:

a pre-distortion module, which is configured to pre-distort a plurality of baseband input signals by an equal number of pre-distortion functions to obtain an equal number of pre-distorted signals respectively, wherein all of the baseband input signals are input into every pre-distortion function, and each pre-distortion function has one output;

an adder, which is configured to combine all of the pre-distorted signals output from every pre-distortion function into one combined signal; and a power amplifier (PA), which is configured to amplify the combined signal, wherein the cascade of the pre-distortion functions and the PA are linear overall.

Wherein the pre-distortion module is a multiple input multiple output (MIMO) pre-distortion module, wherein the number of inputs and outputs of the pre-distortion module are equal to the number of baseband input signals, and each output corresponds to one pre-distortion function;

or the pre-distortion module includes a plurality of pre-distortion units, wherein all of the baseband input signals input into each pre-distortion unit, and each pre-distortion unit corresponds to one pre-distortion function and has one output.

The pre-distorter further comprises:

a frequency shifting module, which is configured to frequency shift the output of each pre-distortion function, wherein a center frequency of the output of each pre-distortion function is shifted to a transmitting carrier frequency.

Wherein the frequency shifting module comprises a plurality of frequency shifters, wherein each output of the pre-distortion module is connected to one or more cascaded frequency shifters, and all frequency shifters shift the center frequency of the output of each pre-distortion function to a transmitting carrier frequency finally;

or each output of the pre-distortion module is connected to one or more cascaded frequency shifters, which shift the center frequency of the output of each pre-distortion function to an intermediary frequency finally, and the outputs of the frequency shifters are connected to the adder, and output of the adder connects one or more cascaded frequency shifters, which shift the center frequency of the output of the adder to transmitting carrier frequencies; or each output of the pre-distortion module is connected to one or more cascaded frequency shifters, which shift the center frequency of the output of each pre-distortion function to an intermediary frequency finally, and the outputs of the frequency shifters are connected to the adder, and output of the adder is connected to one or more cascaded frequency shifters, which shift the center frequency of the output of the adder to transmitting carrier frequencies; or F outputs of the pre-distortion module are connected to one or more cascaded frequency shifters, which shift the center frequency of the output of the pre-distortion function to an intermediary frequency finally, F equal to the number of baseband input signals minus 1, and the outputs of the frequency shifters are connected to the adder, and output of the adder is connected to one or more cascaded frequency shifters, which shift the center frequency of the output of the adder to transmitting carrier frequencies.

The pre-distorter further comprises:

a bandpass filter, which is configured to connect with an output of the PA, and filter out harmonics of said carrier frequencies introduced by the PA, and transmit the filtered signal;

wherein the cascade of the pre-distortion functions, the PA and the bandpass filter are linear overall.

Wherein the pre-distortion functions are $$PD_i(n) = \sum_{j=0}^{M-1} \sum_{k_1=0}^{L_1-1} \sum_{k_2=0}^{L_2-1} \ldots \sum_{k_N=0}^{L_N-1} h_{i,j,k_1,k_2,\ldots,k_N} BB_i(n-j)$$

$$|BB_1(n-j)|^{k_1} |BB_2(n-j)|^{k_2} \ldots |BB_N(n-j)|^{k_N}.$$

Wherein i is between 1 and N, and N is equal to the number of the baseband input signals;

M represents the memory depth of the PA, $L_1, L_2, \ldots, L_{N-1}$ represent the nonlinearity length and the interband crosscorrelation degree of the pre-distortion function, and values used for M, $L_1, L_2, \ldots,$ and $L_{N-1}$ vary based on the PA;

coefficients $h_{i,j,k_1,k_2,\ldots,k_N}$ are chosen such that the cascade of the MIMO pre-distortion function, and the PA will be linear overall;

$BB_i$ are baseband input signals, and $PD_i$ are the pre-distorted signals.

Wherein the coefficients $h_{i,j,k_1,k_2,\ldots,k_N}$ are obtained by solving:

$$PD_i(n) = \sum_{j=0}^{M-1} \sum_{k_1=0}^{L_1-1} \sum_{k_2=0}^{L_2-1} \ldots \sum_{k_N=0}^{L_N-1} \hat{h}_{i,j,k_1,k_2,\ldots,k_N} PO_i(n-j)$$

$$|PO_1(n-j)|^{k_1} |PO_2(n-j)|^{k_2} \ldots |PO_N(n-j)|^{k_N},$$

and in this situation, the values of M, $L_1, L_2, \ldots L_N$ are the same for different i, wherein $PO_i$ are captured signals of the pre-distorted signals, which are captured from the output of the PA.

Wherein the pre-distortion functions are $$PD_i(n) = \sum_{j=0}^{M_i-1} \sum_{k_1=0}^{L_{i,1}-1} \sum_{k_2=0}^{L_{i,2}-1} \ldots \sum_{k_N=0}^{L_{i,N}-1} h_{i,j,k_1,k_2,\ldots,k_N} BB_i(n-j)$$

$$|BB_1(n-j)|^{k_1} |BB_2(n-j)|^{k_2} \ldots |BB_N(n-j)|^{k_N},$$

and in this situation, the values of M, $L_{i,1}, L_{i,2}, \ldots L_{i,N}$ may be different for different i.

Wherein i is between 1 and N, and N is equal to the number of the baseband input signals;

$M_i$ represents the memory depth of the PA, $L_{i,1}, L_{i,2}, \ldots, L_{i,N}$ represent the nonlinearity length and the interband crosscorrelation degree of the pre-distortion function, and values used for $M_i, L_{i,1}, L_{i,2}, \ldots,$ and $L_{i,N}$ vary based on the PA;

coefficients $h_{i,j,k_1,k_2,\ldots,k_N}$ are chosen such that the cascade of the MIMO pre-distortion function, and the PA will be linear overall;

$BB_i$ are baseband input signals, and $PD_i$ are the pre-distorted signals.

Or
the coefficients $h_{i,j,k_1,k_2,\ldots,k_N}$ are obtained by solving:

$$PD_i(n) = \sum_{j=0}^{M_i-1}\sum_{k_1=0}^{L_{i,1}-1}\sum_{k_2=0}^{L_{i,2}-1}\ldots\sum_{k_N=0}^{L_{i,N}-1} \hat{h}_{i,j,k_1,k_2,\ldots,k_N} PO_i(n-j)$$
$$|PO_1(n-j)|^{k_1}|PO_2(n-j)|^{k_2}\ldots|PO_N(n-j)|^{k_N},$$

in this situation, the values of $M_i, L_{i,1}, L_{i,2}, \ldots L_{i,N}$ are the same or different for different i, wherein $PO_i$ are captured signals of the pre-distorted signals, which are captured from the output of the PA.

The pre-distorter further comprises:

a plurality of bandpass filters, which are configured to filter a signal output from the PA, wherein the number of the bandpass filters is equal to the number of the baseband input signals;

a plurality of frequency shifters, which are configured to shift the output signals of each bandpass filters respectively to obtain captured signals $PO_i$, wherein the center frequency of each frequency shifted signal is zero, and the number of the bandpass filters is equal to the number of the baseband input signals;

a capture buffer, which is configured to obtain $PD_i$ and $PO_i$, and output the obtained $PD_i$ and $PO_i$ to a digital data processor (DSP), and the number of inputs of the capture buffer equals to twice of the number of the baseband input signals; and a DSP, which is configured to calculate coefficients $h_{i,j,k_1,k_2,\ldots,k_N}$ by solving the above equations, and output the calculated coefficients $h_{i,j,k_1,k_2,\ldots,k_N}$ to the pre-distortion module.

Wherein the DSP is configured to use least squares minimization $\vec{h}=(H_i^H H_i)^{-1} H_i^H \vec{p}_{di}$ to solve the equation $$PD_i(n) = \sum_{j=0}^{M-1}\sum_{k_1=0}^{L_1-1}\sum_{k_2=0}^{L_2-1}\ldots\sum_{k_N=0}^{L_N-1} \hat{h}_{i,j,k_1,k_2,\ldots,k_N} PO_i(n-j)$$
$$|PO_1(n-j)|^{k_1}|PO_2(n-j)|^{k_2}\ldots|PO_N(n-j)|^{k_N}$$

or $$PD_i(n) = \sum_{j=0}^{M_i-1}\sum_{k_1=0}^{L_{i,1}-1}\sum_{k_2=0}^{L_{i,2}-1}\ldots\sum_{k_N=0}^{L_{i,N}-1} \hat{h}_{i,j,k_1,k_2,\ldots,k_N} PO_i(n-j)$$
$$|PO_1(n-j)|^{k_1}|PO_2(n-j)|^{k_2}\ldots|PO_N(n-j)|^{k_N}$$

to obtain the values of $\hat{h}_{i,j,k_1,k_2,\ldots,k_N}$,
wherein $$\vec{p}_{di} = \begin{bmatrix} PD_i(1) \\ PD_i(2) \\ \ldots \end{bmatrix},$$

$$\vec{h}_i = \begin{bmatrix} \hat{h}_{i,0,0,\ldots,0,0} \\ \ldots \\ \hat{h}_{i,0,0,\ldots,0,L_N-1} \\ \hat{h}_{i,0,0,\ldots,1,0} \\ \ldots \\ \hat{h}_{i,0,0,\ldots,1,L_N-1} \\ \ldots \\ \hat{h}_{i,0,0,\ldots,L_{N-1}-1,0} \\ \ldots \\ \hat{h}_{i,0,0,\ldots,L_{N-1}-1,L_N-1} \\ \ldots \\ \hat{h}_{i,1,0,\ldots,0,0} \\ \ldots \\ \hat{h}_{i,M-1,L_1-1,\ldots,L_{N-1}-1,L_N-1} \end{bmatrix},$$

and $H_i$ is a matrix, and elements in the matrix are expressed as $PO_i(n-j)|PO_1(n-j)|^{k_1}|PO_1(n-j)|^{k_2}\ldots|PO_i(n-j)|^{k_i}\ldots|PO_N(n-j)|^{k_N}$, and row n of $H_i$ can be described as:

$$\begin{bmatrix} PO_i(n-0)|PO_1(n-0)|^0|PO_2(n-0)|^0 \ldots |PO_{N-1}(n-0)|^0|PO_N(n-0)|^0 \\ PO_i(n-0)|PO_1(n-0)|^0|PO_2(n-0)|^0 \ldots |PO_{N-1}(n-0)|^0|PO_N(n-0)|^1 \\ \ldots \\ PO_i(n-0)|PO_1(n-0)|^0|PO_2(n-0)|^0 \ldots |PO_{N-1}(n-0)|^0|PO_N(n-0)|^{L_N-1} \\ PO_i(n-0)|PO_1(n-0)|^0|PO_2(n-0)|^0 \ldots |PO_{N-1}(n-0)|^1|PO_N(n-0)|^0 \\ PO_i(n-0)|PO_1(n-0)|^0|PO_2(n-0)|^0 \ldots |PO_{N-1}(n-0)|^1|PO_N(n-0)|^1 \\ \ldots \\ PO_i(n-0)|PO_1(n-0)|^0|PO_2(n-0)|^0 \ldots |PO_{N-1}(n-0)|^1|PO_N(n-0)|^{L_N-1} \\ PO_i(n-0)|PO_1(n-0)|^0|PO_2(n-0)|^0 \ldots |PO_{N-1}(n-0)|^2|PO_N(n-0)|^0 \\ PO_i(n-0)|PO_1(n-0)|^0|PO_2(n-0)|^0 \ldots |PO_{N-1}(n-0)|^2|PO_N(n-0)|^1 \\ \ldots \\ PO_i(n-0)|PO_1(n-0)|^{L_1-1}|PO_2(n-0)|^{L_2-1} \ldots |PO_{N-1}(n-0)|^{L_{N-1}-1}|PO_N(n-0)|^{L_N-1} \\ PO_i(n-1)|PO_1(n-1)|^0|PO_2(n-1)|^0 \ldots |PO_{N-1}(n-1)|^0|PO_N(n-1)|^0 \\ \ldots \\ PO_i(n-1)|PO_1(n-1)|^{L_1-1}|PO_2(n-1)|^{L_2-1} \ldots |PO_{N-1}(n-1)|^{L_{N-1}-1}|PO_N(n-1)|^{L_N-1} \\ PO_i(n-2)|PO_1(n-2)|^0|PO_2(n-2)|^0 \ldots |PO_{N-1}(n-2)|^0|PO_N(n-2)|^0 \\ \ldots \\ PO_i(n-M_i)|PO_1(n-M_i)|^{L_1-1}|PO_2(n-M_i)|^{L_2-1} \ldots |PO_{N-1}(n-M_i)|^{L_{N-1}-1}|PO_N(n-M_i)|^{L_N-1} \end{bmatrix}^T$$

or $$\vec{p}_{di} = \begin{bmatrix} PD_i(1) \\ PD_i(2) \\ \cdots \end{bmatrix}, \vec{h}_i = \begin{bmatrix} \hat{h}_{i,0,0,\ldots,0,0} \\ \cdots \\ \hat{h}_{i,0,0,\ldots,0,L_{i,N}-1} \\ \hat{h}_{i,0,0,\ldots,1,0} \\ \cdots \\ \hat{h}_{i,0,0,\ldots,1,L_{i,N}-1} \\ \cdots \\ \hat{h}_{i,0,0,\ldots,L_{i,N}-1,0} \\ \cdots \\ \hat{h}_{i,0,0,\ldots,L_{i,N}-1,L_{i,N}-1} \\ \cdots \\ \hat{h}_{i,1,0,\ldots,0,0} \\ \cdots \\ \hat{h}_{i,M_i-1,L_{i,1}-1,\ldots,L_{i,N-1}-1,L_{i,N}-1} \end{bmatrix},$$

and $H_i$ is a matrix, and elements in the matrix are expressed as $PO_i(n-j)|PO_1(n-j)|^{k_1}|PO_1(n-j)|^{k_2} \ldots |PO_i(n-j)|^{k_i} \ldots |PO_N(n-j)|^{k_N}$, and row n in the matrix is expressed as:

$$\begin{bmatrix} PO_i(n-0)|PO_1(n-0)|^0|PO_2(n-0)|^0 \ldots |PO_{N-1}(n-0)|^0|PO_N(n-0)|^0 \\ PO_i(n-0)|PO_1(n-0)|^0|PO_2(n-0)|^0 \ldots |PO_{N-1}(n-0)|^0|PO_N(n-0)|^1 \\ \cdots \\ PO_i(n-0)|PO_1(n-0)|^0|PO_2(n-0)|^0 \ldots |PO_{N-1}(n-0)|^0|PO_N(n-0)|^{L_{i,N}-1} \\ PO_i(n-0)|PO_1(n-0)|^0|PO_2(n-0)|^0 \ldots |PO_{N-1}(n-0)|^1|PO_N(n-0)|^0 \\ PO_i(n-0)|PO_1(n-0)|^0|PO_2(n-0)|^0 \ldots |PO_{N-1}(n-0)|^1|PO_N(n-0)|^1 \\ \cdots \\ PO_i(n-0)|PO_1(n-0)|^0|PO_2(n-0)|^0 \ldots |PO_{N-1}(n-0)|^1|PO_N(n-0)|^{L_{i,N}-1} \\ PO_i(n-0)|PO_1(n-0)|^0|PO_2(n-0)|^0 \ldots |PO_{N-1}(n-0)|^2|PO_N(n-0)|^0 \\ PO_i(n-0)|PO_1(n-0)|^0|PO_2(n-0)|^0 \ldots |PO_{N-1}(n-0)|^2|PO_N(n-0)|^1 \\ \cdots \\ PO_i(n-0)|PO_1(n-0)|^{L_{i,1}-1}|PO_2(n-0)|^{L_{i,2}-1} \ldots |PO_{N-1}(n-0)|^{L_{i,N-1}-1}|PO_N(n-0)|^{L_{i,N}-1} \\ PO_i(n-1)|PO_1(n-1)|^0|PO_2(n-1)|^0 \ldots |PO_{N-1}(n-1)|^0|PO_N(n-1)|^0 \\ \cdots \\ PO_i(n-1)|PO_1(n-1)|^{L_{i,1}-1}|PO_2(n-1)|^{L_{i,2}-1} \ldots |PO_{N-1}(n-1)|^{L_{i,N-1}-1}|PO_N(n-1)|^{L_{i,N}-1} \\ PO_i(n-2)|PO_1(n-2)|^0|PO_2(n-2)|^0 \ldots |PO_{N-1}(n-2)|^0|PO_N(n-2)|^0 \\ \cdots \\ PO_i(n-M_i)|PO_1(n-M_i)|^{L_{i,1}-1}|PO_2(n-M_i)|^{L_{i,2}-1} \ldots |PO_{N-1}(n-M_i)|^{L_{i,N-1}-1}|PO_N(n-M_i)|^{L_{i,N}-1} \end{bmatrix}^T .$$

Another example of the document provides a method for pre-distorting, and the method comprises:

a plurality of baseband input signals being pre-distorted by an equal number of pre-distortion functions to obtain an equal number of pre-distorted signals respectively, wherein all of the baseband input signals input into every pre-distortion function, and each pre-distortion function has one output;

the pre-distorted signals being combined into one signal;

the combined signal being amplified by a power amplifier (PA), wherein the cascade of the pre-distortion functions and the PA are linear overall.

After the step of a plurality of baseband input signals being pre-distorted by an equal number of pre-distortion functions, the method further comprises:

the pre-distorted signal of each pre-distortion function being frequency shifted, wherein a center frequency of the pre-distorted signal of each pre-distortion function is shifted to a transmitting carrier frequency.

After the step of the combined signal being power amplified by a PA, the method further comprises:

the output signal of the PA passing through a bandpass filter which filters out harmonics of said carrier frequencies introduced by the PA, and the bandpass filter transmitting the filtered signal;

wherein the cascade of the pre-distortion functions, the PA and the bandpass filter are linear overall.

Below the document will be described in detail by presenting particular examples.

Figure 3:
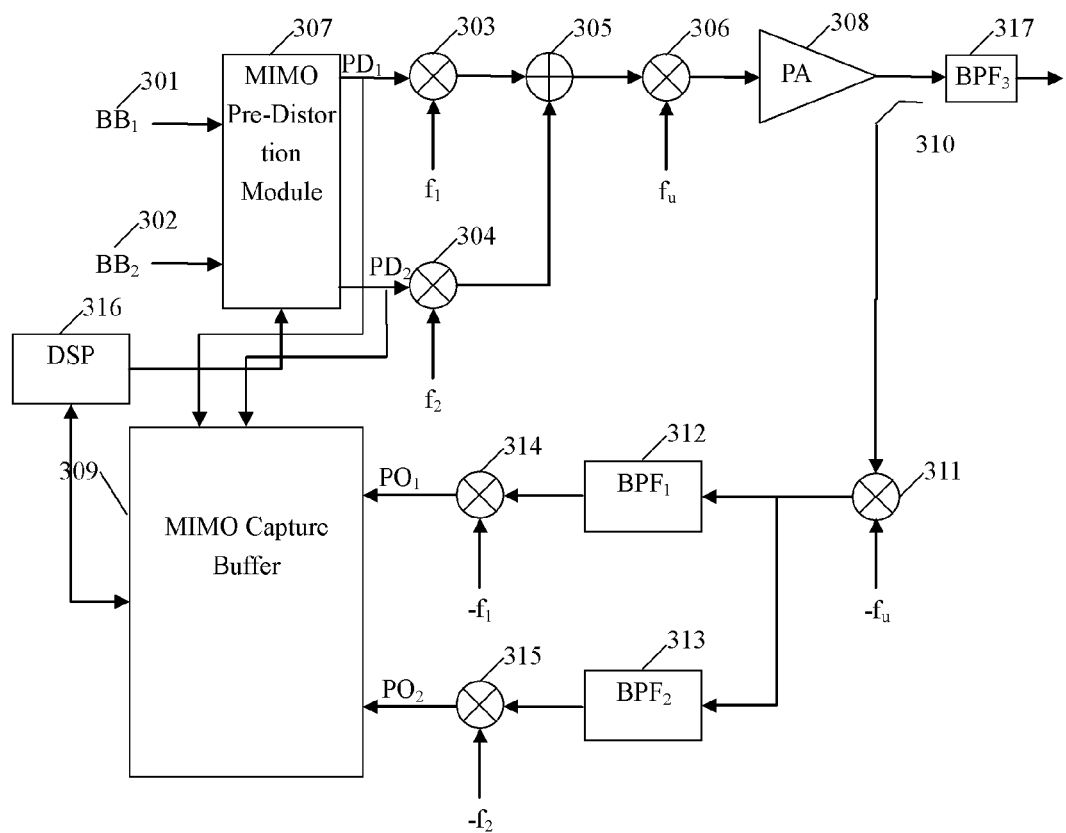
FIG. 3 is a sketch map of the architecture of the multiband pre-distorter according to an example of the document.

This example will describe two baseband input signals as an example, but the document is not limited to two baseband input signals. The architecture of the multiband digital pre-distorter (dual band digital pre-distorter in this example) according to this example is shown in FIG. 3. The baseband signals $BB_1$ 301 and $BB_2$ 302 are centered at 0 Hz and have bandwidths $B_1$ and $B_2$ respectively. The intent of the multiband digital pre-distorter is that $BB_1$ 301 and $BB_2$ 302 appear on the output of the PA 308 centered at $f_{c1}$ and $f_{c2}$ respectively. Without loss of generality, the discussion here will assume that both signals $BB_1$ 301 and $BB_2$ 302 are sampled at a rate of $f_s$ and that $f_{c1} < f_{c2}$. Further restrictions on the sampling rate $f_s$ will be presented later in this application.

Baseband signals $BB_1$ 301 and $BB_2$ 302 are sent into a multiple input multiple output (MIMO) pre-distortion module 307 to produce signals $PD_1$ and $PD_2$, and the MIMO pre-distortion module 307 processes baseband signals $BB_1$ 301 and $BB_2$ 302 with a MIMO pre-distortion function. Signals $PD_1$ and $PD_2$ are sent into frequency shifters 303 and 304 which shift the frequency of the signals $PD_1$ and $PD_2$ to $f_1$ and $f_2$ respectively. Then these shifted signals are combined by an adder 305. Wherein the MIMO pre-distortion function includes at least two pre-distortion functions, and each pre-distortion function has two inputs and one output. The number of the inputs for each pre-distortion function is equal to the number of the baseband signals input into the multiband digital pre-distorter, and the number of the pre-distortion functions is equal to the number of the baseband signals input into the multiband digital pre-distorter.

Preferably, the combined signal is forwarded to a final frequency shifter 306 which shifts the combined frequency by $f_u$. It should be clear that $f_1 + f_u = f_{c1}$ and $f_2 + f_u = f_{c2}$. Also, $f_{c2} - f_{c1} = f_2 - f_1$. Below the situation to be described is one in which the combined signal is forwarded to a final frequency shifter 306.

If there is the final frequency shifter 306 in the multiband digital pre-distorter, the output of the final frequency shifter 306 is sent to a power amplifier (PA) 308; or if there is no final frequency shifter 306, the output of the adder 305 is sent directly to a power amplifier (PA) 308. The PA 308 produces the final signal which will be transmitted.

The PA 308 is typically a low efficiency device and one method that can be used to improve its efficiency is to drive it into its nonlinear region. The problem is that the more the PA is driven into its nonlinear region, the higher the amount of distortion is introduced by the PA.

The output of the PA 308 is connected to a bandpass filter $BPF_3$ 317 which filters out harmonics of the carrier frequencies $f_{c1}$ and $f_{c2}$. As known to someone skilled in the art, if a non-linear PA is presented with a signal centered at $f_{c1}$ and $f_{c2}$, the output of the PA will contain desired signals at $f_{c1}$ and $f_{c2}$, but it will also contain energy at frequencies $f_{c1} - (f_{c2} - f_{c1})$ and $f_{c2} + (f_{c2} - f_{c1})$. Stated in general terms, $BPF_3$ 317 will remove the distortion products introduced by the PA 308 far away from the transmission carrier frequencies $f_{c1}$ and $f_{c2}$ whereas the rest of the application will remove the distortion products introduced by the PA 308 nearby and on top of the carrier frequencies.

The goal of the MIMO pre-distortion function (which is also a non-linear function) is to produce signals $PD_1$ and $PD_2$ sent to the PA 308 such that the output of the $BPF_3$ 317 only contains signals $BB_1$ 301 and $BB_2$ 302 centered at frequencies $f_{c1}$ and $f_{c2}$. No system is perfect and the output of the $BPF_3$ 317 in this example will also contain some distortions, but the MIMO pre-distortion function in this example attempts to minimize these distortions as much as possible. Although the MIMO pre-distortion function and the PA 308 are individually non-linear, the cascade of the MIMO pre-distortion function, the PA 308, and $BPF_3$ 317 produces a system that is linear overall.

Although many functions can be used for the MIMO pre-distortion function, one two-input two-output pre-distortion function that can be used for the MIMO pre-distortion function in this example is given in equations Eq 15 and Eq 16:

$$PD_1(n) = \sum_{j=0}^{M-1} \sum_{k_1=0}^{L_1-1} \sum_{k_2=0}^{L_2-1} h_{1,j,k_1,k_2} BB_1(n-j) |BB_1(n-j)|^{k_1} |BB_2(n-j)|^{k_2} \quad \text{Eq 15}$$

$$PD_2(n) = \sum_{j=0}^{M-1} \sum_{k_1=0}^{L_1-1} \sum_{k_2=0}^{L_2-1} h_{2,j,k_1,k_2} BB_2(n-j) |BB_1(n-j)|^{k_1} |BB_2(n-j)|^{k_2} \quad \text{Eq 16}$$

Wherein, M represents the memory depth of the PA 308. That is, the PA's 308 output is considered to be a function of the current input sample and the previous M−1 input samples. $L_1$ and $L_2$ represent the nonlinearity length and the interband crosscorrelation degree of the MIMO pre-distortion model. The actual values used for M, $L_1$, and $L_2$ will vary based on the actual PA 308 that is used but typically, M will be a rather small number typically between 1 and 6. The values of $L_1$ and $L_2$ will be slightly larger than M and typically between 3 and 15. The coefficients $h_{1,j,k_1,k_2}$ and $h_{2,j,k_1,k_2}$ are chosen such that the cascade of the MIMO pre-distortion function 307, the PA 308, and $BPF_3$ 317 will be linear overall. And each equation such as Eq 15 and Eq 16 is called a pre-distortion function.

Notably, different values or the same value for M, $L_1$, or $L_2$ can be used for each pre-distortion function, such as the value of M in Eq 15 and Eq 16 can be equal or not. Similarly, the value of $L_1$ or $L_2$ in Eq 15 need not be the same as the value of $L_1$ or $L_2$ in Eq 16.

One method used to calculate the coefficients $h_{1,j,k_1,k_2}$ and $h_{2,j,k_1,k_2}$ is to adapt the indirect learning architecture described in the "Background" section in this application into a MIMO indirect learning architecture. The concept of the MIMO indirect learning architecture is that a model is created which models the inputs of the PA 308 based on the outputs of the PA 308. Once such a model is created, the model is used directly as the pre-distortion function. In this example, the model has two inputs and two outputs, and the model is implemented using two pre-distortion functions and each function has two inputs, but each pre-distortion function produces two outputs that are not related to each other. Each individual output is dependent on all the inputs, and each output is a function of all the inputs.

In one example, this model is created by capturing the samples of several signals using a MIMO capture buffer 309. The number of samples required to be captured by the MIMO capture buffer 309 varies based on the PA 308 and the type of signals to be transmitted, but typically, between 2000 and 10000 samples of each signal coming into the MIMO capture buffer 309 will need to be captured.

Two of the signals recorded by the MIMO capture buffer 309 in this example are $PD_1$ and $PD_2$, which are produced by the multiple input multiple output (MIMO) pre-distortion module 307. The other two signals recorded by the MIMO capture buffer 309 are derived from a signal output from a coupler 310 which extracts a small portion (typically less than 1% of the PA output power) of the signal output from the PA 308. The key property of the coupler 310 is that it produces a signal which is an accurate representation of the actual output of the PA 308. The output of the coupler 310 is connected to a frequency shifter 311 which shifts the signal down by $f_u$ Hz.

The output of the frequency shifter 311 is connected to two bandpass filters $BPF_1$ 312 and $BPF_2$ 313 respectively. These bandpass filters $BPF_1$ 312 and $BPF_2$ 313 are centered at frequencies $f_1$ and $f_2$ respectively. The bandwidths of these bandpass filters vary based on the PA 308 and the types of signals transmitted by the PA 308. A rule of thumb is that typically, the bandwidths of these bandpass filters $BPF_1$ 312 and $BPF_2$ 313 need to be 3-6 times the bandwidths $B_1$ and $B_2$ of the corresponding signals. For example, the bandwidth of $BPF_1$ 312 typically needs to be between $3B_1$ and $6B_1$. To simplify the discussion in this application, the bandwidth requirement of the bandpass filters $BPF_1$ 312 and $BPF_2$ 313 will be assumed to be 6 times the bandwidths of the corresponding signal being transmitted, as shown in Eq 17 and Eq 18.

$$\text{Bandwidth}(BPF_1) = 6B_1 \quad \text{Eq 17}$$

$$\text{Bandwidth}(BPF_2) = 6B_2 \quad \text{Eq 18}$$

The outputs of $BPF_1$ 312 and $BPF_2$ 313 are sent into two frequency shifters 314 and 315, which shift the signals down by $f_1$ and $f_2$, respectively, to produce signals $PO_1$ and $PO_2$, respectively. The outputs from these frequency shifters 314 and 315 are captured by the MIMO capture buffer 309.

The capture buffer is typically controlled by a Digital Signal Processor (DSP) 316 which, through the use of a trigger signal, indicates when the capture buffer should begin capturing data. Once the capture buffer receives a trigger signal, it begins to capture data until the memory of the capture buffer has been completely filled. All possible triggering methods can be used, and the document is not limited to any one particular triggering method.

Typically, a DSP 316 is used to read out the values captured in the MIMO capture buffer 309 and based on the captured values $PD_1$, $PD_2$, $PO_1$ and $PO_2$, the following equations Eq 19 and Eq 20 are solved by the DSP 316 using least squares minimization to obtain the values of $\hat{h}_{1,j,k_1,k_2}$ and $\hat{h}_{2,j,k_1,k_2}$.

$$PD_1(n) = \sum_{j=0}^{M-1}\sum_{k_1=0}^{L_1-1}\sum_{k_2=0}^{L_2-1} \hat{h}_{1,j,k_1,k_2} PO_1(n-j)|PO_1(n-j)|^{k_1}|PO_2(n-j)|^{k_2} \quad \text{Eq 19}$$

$$PD_2(n) = \sum_{j=0}^{M-1}\sum_{k_1=0}^{L_1-1}\sum_{k_2=0}^{L_2-1} \hat{h}_{2,j,k_1,k_2} PO_2(n-j)|PO_1(n-j)|^{k_1}|PO_2(n-j)|^{k_2} \quad \text{Eq 20}$$

Specifically, the above equations Eq 19 and Eq 20 can be expressed using matrix arithmetic as Eq 21 and Eq 22:

$$\vec{p}_{d1} = H_1 \vec{h}_1 \quad \text{Eq 21}$$

$$\vec{p}_{d2} = H_2 \vec{h}_2 \quad \text{Eq 22}$$

Wherein $$\vec{p}_{da} = \begin{bmatrix} PD_a(1) \\ PD_a(2) \\ \ldots \end{bmatrix}, a \in \{1, 2\} \quad \text{Eq 23}$$

$$\vec{h}_a = \begin{bmatrix} \hat{h}_{a,0,0,0} \\ \ldots \\ \hat{h}_{a,0,0,L_2-1} \\ \hat{h}_{a,0,1,0} \\ \ldots \\ \hat{h}_{a,0,L_1-1,L_2-1} \\ \hat{h}_{a,1,0,0} \\ \ldots \\ \hat{h}_{a,M-1,L_1-1,L_2-1} \end{bmatrix}, a \in \{1, 2\} \quad \text{Eq 24}$$

The matrix $H_1$ can be constructed column-wise by examining the $\vec{h}_1$ vector. For example, if the $16^{th}$ row of $\vec{h}_1$ contains $\hat{h}_{1,a,b,c}$, then the $16^{th}$ column of $H_1$ contains elements shown in Eq 25:

$$\begin{bmatrix} PO_1(1-a)|PO_1(1-a)|^b|PO_2(1-a)|^c \\ PO_1(2-a)|PO_1(2-a)|^b|PO_2(2-a)|^c \\ PO_1(3-a)|PO_1(3-a)|^b|PO_2(3-a)|^c \\ \ldots \end{bmatrix} \quad \text{Eq 25}$$

Thus, all columns of $H_1$ can be constructed by examining the rows of $\vec{h}_1$.

The $H_2$ matrix can be constructed column-wise by examining the $\vec{h}_2$ vector. For example, if the $16^{th}$ row of $\vec{h}_2$ contains $\hat{h}_{2,a,b,c}$, then the $16^{th}$ column of $H_2$ contains elements shown in Eq 26:

$$\begin{bmatrix} PO_2(1-a)|PO_1(1-a)|^b|PO_2(1-a)|^c \\ PO_2(2-a)|PO_1(2-a)|^b|PO_2(2-a)|^c \\ PO_2(3-a)|PO_1(3-a)|^b|PO_2(3-a)|^c \\ \ldots \end{bmatrix} \quad \text{Eq 26}$$

Thus, all columns of H2 can be constructed by examining the rows of $\vec{h}_2$.

The least squares solution to the overdetermined equations above is expressed in equations Eq 27 and Eq 28:

$$\vec{h}_1 = (H_1^H H_1)^{-1} H_1^H \vec{p}_{d1} \quad \text{Eq 27}$$

$$\vec{h}_2 = (H_2^H H_2)^{-1} H_2^H \vec{p}_{d2} \quad \text{Eq 28}$$

Therefore, the DSP 316 can obtain the values of $\hat{h}_{1,j,k_1,k_2}$ and $\hat{h}_{2,j,k_1,k_2}$ by solving the equations Eq 27 and Eq 28.

It should be clear to one skilled in the art that although this application describes a specific method to construct the $\vec{p}_{da}$, $H_a$, and $\vec{h}_a$ vectors and matrices (a is either 1 or 2), a vast number of variations are possible that do not depart from the scope of this application. For example, any two rows of $\vec{p}_{da}$ can be exchanged as long as the same rows of $H_a$ are exchanged. Furthermore, any two columns (j and k) of $H_a$ can be exchanged as long as the same rows (j and k) of $\vec{h}_a$ are exchanged.

The general operation of the multiband digital pre-distorter is that when the multiband digital pre-distorter is first turned on, initially, $h_{1,0,0,0}$ and $h_{2,0,0,0}$ will both be set to 1 and all other values for $\hat{h}_{1,a,b,c}$ and $\hat{h}_{2,a,b,c}$ will be set to zero. When some samples are captured by the MIMO capture buffer 309, the samples are analyzed by the DSP so as to produce the vectors $\vec{h}_1$ and $\vec{h}_2$ and all of values in $\hat{h}_{1,j,k_1,k_2}$ and $\hat{h}_{2,j,k_1,k_2}$. After these values have been calculated, the DSP transmits these values to the MIMO pre-distortion module and all of the $h_{1,j,k1,k2}$ and $h_{2,j,k1,k2}$ values of the MIMO pre-distortion function in the MIMO pre-distortion module will be simultaneously updated and replaced with the $\hat{h}_{1,j,k_1,k_2}$ and $\hat{h}_{2,j,k_1,k_2}$ values.

The process of capturing data, performing calculations, and finally updating the coefficients $h_{1,j,k1,k2}$ and $h_{2,j,k1,k2}$ can be considered one iteration. Typically, several iterations are performed so as to reach a final optimal solution. Also, if it is known that the characteristics of the PA will be changing in time, iterations may be performed continuously.

The sampling rates of the signals input into the MIMO pre-distortion function, signals output from the MIMO pre-distortion function, and signals coming from the feedback frequency shifters ($PO_1$, $PO_2$), are usually the same, which are represented in this application by a variable $f_s$.

According to the pre-distortion functions expressed in Eq 15 and Eq 16, because the signals $BB_1$ 301 and $BB_2$ 302 have bandwidths $B_1$ and $B_2$ respectively, and both signal $BB_1$ 301 and $BB_2$ 302 are baseband signals, so the bandwidths of the signal output from the Eq 15 and Eq 16 are equal to the larger one of $B_1$ and $B_2$, which are not a function of $B_{deadspace}$. Besides, as the pre-distortion function in the related art (such as the dual band digital pre-distortion system shown in FIG. 1), the MIMO pre-distortion function in this example expands the bandwidth of the signal going through it for the purpose of sufficiently linearizing the PA 308. For example, although signals $BB_1$ 301 and $BB_2$ have bandwidths $B_1$ and $B_2$ respectively, the bandwidth of $PD_1$ and $PD_2$ respectively coming out of the MIMO pre-distortion function will be much larger than the larger one of $B_1$ and $B_2$. Although the actual bandwidth of $PD_1$ depends on the specific power amplifier being used and the specific signals being transmitted, typically, this bandwidth will be about 5 to 7 times the larger one of $B_1$ and $B_2$. In order to simplify the description in this application, it will be assumed that the bandwidth of $PD_1$ and $PD_2$ will be 7*max($B_1$,$B_2$).

It has been previously stated that the bandwidth of the $PO_1$ and $PO_2$ signals will be about $6B_1$ and $6B_2$ respectively. Thus, the maximum bandwidth that must be supported by any of the baseband signals of interest (signals input into the MIMO pre-distortion function, signals output from the MIMO pre-distortion function, and signals ($PO_1$, $PO_2$) coming from the feedback frequency shifters 314 and 315) will be 7*max($B_1$, $B_2$).

Thus, in the example of the document, the minimum sampling frequency of the system, and the frequency at which the MIMO pre-distortion function will operate, is:

$$f_{s,min,invention} = 7*\max(B_1,B_2) \quad \text{Eq 29}$$

As in the related art, the implementation cost of the document is dependent on $f_{s,min,invention}$. The larger $f_{s,min,invention}$, the higher the implementation cost of the document.

One can compare this equation to Eq 14 which is repeated here:

$$f_{s,min,prior\_art} = 7(B_1+B_2+B_{deadspace}) \quad \text{Eq 30}$$

Because this application pre-distorts the complex baseband signals input into the multiband pre-distorter instead of pre-distorting a frequency shifted signal (as was done in the related art), so, in this example, the sampling rate of the document does not depend on $B_{deadspace}$ at all. This means that regardless of whether the two bands are separated by 100 MHz or 1 GHz, the implementation cost of the document remains constant.

Although a specific realization of the document has been described in this application, it should be clear to an ordinary person skilled in the art that various modifications to the described invention can be performed while remaining within the spirit of the invention.

Figure 4:
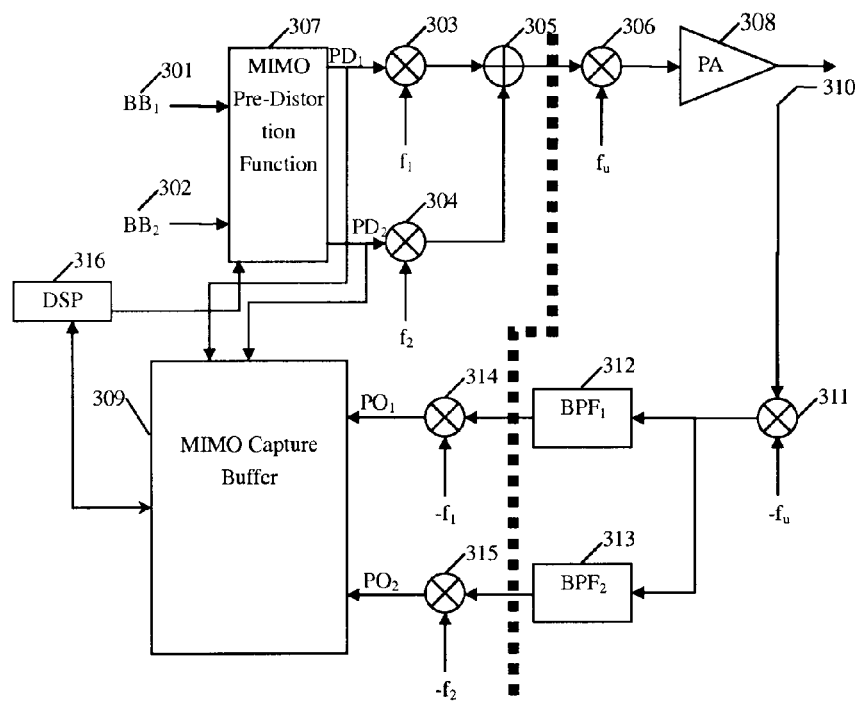
FIG. 4 is a sketch map of a multiband pre-distorter according to an example of the document.

Below an example of the document will be described with reference to FIG. 4.

For example, the example in FIG. 3 of the document does not explicitly indicate where the digital to analog boundary will appear. The bold dotted line in FIG. 4 represents one example of where this boundary may be placed. The bold dotted line represents the boundary between the digital domain and the analog domain in the multiband pre-distorter. Entities and signals to the left of the bold dotted line are digital and entities and signals to the right are analog. Signal conversion from the digital to the analog domain can be implemented by a D/A converter and signal conversion from the analog to the digital domain can be implemented by an A/D converter. Those skilled in the art will recognize that the digital-analog boundary can be placed in many different locations.

As another example, the signal upconversion process (namely, shifting the frequency of the signals $PD_1$ and $PD_2$ to $f_1$ and $f_2$) was illustrated through the use of two cascaded frequency shifters. The first frequency shifter had a frequency offset of $f_1$ or $f_2$ (depending on the band), and the second frequency shifter had an offset of $f_u$. It should be clear to those skilled in the art that various different frequency shifting architectures are possible, even architectures that use multiple stages and multiple frequency shifters.

The downconversion process (namely, shifting the frequency of the output of the coupler 310) was similarly illustrated through the use of two cascaded frequency shifters. The first shifted by $-f_u$ and the second shifted by $-f_1$ or $-f_2$ (depending on the band). Again, it should be clear to those skilled in the art that different frequency conversion architectures are possible, even architectures that use multiple stages and multiple frequency shifters.

Another example is that the preferred embodiment assumes that the propagation delay through any one element in the chain is 0. This was done to simplify the description of the document. It should be clear to one skilled in the art that a real system will have a non-zero delay. This delay can be measured and compensated by inserting an equivalent delay on the $PD_1$ and $PD_2$ signals as they enter the MIMO capture buffer 309.

Another example is that although the document was described in the context of a multiband pre-distorter attempting to send two signals on two different frequency bands, the document can be easily extended to handle more than two bands. The $_{MIMO}$ capture buffer would capture 2N signals ($BB_1$ through $BB_N$ and $PO_1$ through $PO_N$) where N is the number of frequency bands to be supported. The MIMO pre-distortion function, which was described previously as a two input two output function would become an N-input N-output function.

Furthermore, $BPF_3$ will again have to filter out harmonics in the output of the PA, but in the multiband situation, many more harmonics will be present. Specifically, all harmonics at frequencies $f_{ca}+/-(f_{cb}-f_{cd})$ must be filtered out for values of a, b, and d between 1 and N. a, b, and d must be unique in that a!=b, b!=d, and a!=d. Note that if it is the case that $f_{ca}+/-(f_{cb}-f_{cd})=f_{ce}$, for a, b, and d restricted as before and e is unequal to a, b, and d, then this version of the invention cannot be used. In other words, if a harmonic product happens to land on top of a desired carrier frequency, then this version of the invention cannot be used.

Note that in the case when N is 2, it is impossible for a harmonic to land on top of a desired carrier frequency and hence this document can always be used. If there are 3 or more bands, however, the bands must be chosen so that harmonics do not land on top of a desired carrier frequency.

An example MIMO pre-distortion function that would be valid for N bands is:

$$PD_i(n) = \sum_{j=0}^{M-1}\sum_{k_1=0}^{L_1-1}\sum_{k_2=0}^{L_2-1}\ldots\sum_{k_N=0}^{L_N-1} h_{i,j,k_1,k_2,\ldots,k_N} BB_i(n-j)|BB_1(n-j)|^{k_1} |BB_2(n-j)|^{k_2}\ldots|BB_N(n-j)|^{k_N} \quad \text{Eq 31}$$

Wherein i is between 1 and N. As before, M will take on values typically between 0 and 6. The $L_1, L_2, \ldots, L_N$ values are constants that are determined empirically and will typically be rather small, between 0 and 10.

Again, the coefficients $\hat{h}_{i,j,k_1,k_2,\ldots,k_N}$ can be obtained by solving the following sets of equations Eq 32, as has been described previously in this application:

$$PD_i(n) = \sum_{j=0}^{M-1}\sum_{k_1=0}^{L_1-1}\sum_{k_2=0}^{L_2-1}\ldots\sum_{k_N=0}^{L_N-1} \hat{h}_{i,j,k_1,k_2,\ldots,k_N} PO_i(n-j)|PO_1(n-j)|^{k_1}$$
$$|PO_2(n-j)|^{k_2}\ldots|PO_N(n-j)|^{k_N} \quad \text{Eq 32}$$

Another example is that although in Eq 31 and Eq 32 each function had the same M and L values, it is possible to have varying values for each pre-distortion function. For example, it should be clear to one skilled in the art that the following equations can also be used for a multiband DPD system:

$$PD_i(n) = \sum_{j=0}^{M_i-1}\sum_{k_1=0}^{L_{i,1}-1}\sum_{k_2=0}^{L_{i,2}-1}\ldots\sum_{k_N=0}^{L_{i,N}-1} h_{i,j,k_1,k_2,\ldots,k_N} BB_i(n-j)|BB_1(n-j)|^{k_1}$$
$$|BB_2(n-j)|^{k_2}\ldots|BB_N(n-j)|^{k_N} \quad \text{Eq 33}$$

$$PD_i(n) = \sum_{j=0}^{M_i-1}\sum_{k_1=0}^{L_{i,1}-1}\sum_{k_2=0}^{L_{i,2}-1}\ldots\sum_{k_N=0}^{L_{i,N}-1} \hat{h}_{i,j,k_1,k_2,\ldots,k_N} PO_i(n-j)|PO_1(n-j)|^{k_1}$$
$$|PO_2(n-j)|^{k_2}\ldots|PO_N(n-j)|^{k_N} \quad \text{Eq 34}$$

INDUSTRIAL APPLICABILITY

The document pre-distorts the complex baseband signals input into the multiband pre-distorter instead of pre-distorting a frequency shifted signal, so the sampling rate of the document does not depend on $B_{deadspace}$ at all. This means that regardless of whether the two bands are separated by 100 MHz or 1 GHz, the implementation cost of the document remains constant. Therefore, the document reduces the implementation cost of a pre-distorter, and the implementation cost in the document does not depend on $B_{deadspace}$.

What is claimed is:

1. A pre-distorter, which comprises:
a pre-distortion module, which is configured to pre-distort a plurality of baseband input signals by an equal number of pre-distortion functions to obtain an equal number of pre-distorted signals respectively, wherein the number of the inputs of each pre-distortion function is equal to the number of the plurality of baseband input signals, and all of the plurality of baseband input signals are input into each of the pre-distortion functions, and each of the pre-distortion functions has one output which is dependent on all of the inputs of the pre-distortion function;
a frequency shifting module, which is configured to frequency shift the output of each pre-distortion function of the pre-distortion module, wherein a center frequency of the output of each pre-distortion function is shifted to a transmitting carrier frequency;
an adder, which is configured to combine all of the frequency-shifted outputs from the frequency shifting module into one combined signal; and
a power amplifier (PA), which is configured to amplify the combined signal, wherein the cascade of the pre-distortion functions and the PA are linear overall.

2. The pre-distorter as claimed in claim 1, wherein
the pre-distortion module is a multiple input multiple output (MIMO) pre-distortion module, wherein the number of inputs and outputs of the pre-distortion module are equal to the number of baseband input signals, and each output corresponds to one pre-distortion function;
or
the pre-distortion module includes a plurality of pre-distortion units, wherein all of the baseband input signals input into each pre-distortion unit, and each pre-distortion unit corresponds to one pre-distortion function and has one output.

3. The pre-distorter as claimed in claim 1, wherein the frequency shifting module comprises a plurality of frequency shifters, wherein
each output of the pre-distortion module is connected to one or more cascaded frequency shifters, and all frequency shifters shift the center frequency of the output of each pre-distortion function to a transmitting carrier frequency finally; or
each output of the pre-distortion module is connected to one or more cascaded frequency shifters, which shift the center frequency of the output of each pre-distortion function to an intermediary frequency finally, and the outputs of the frequency shifters are connected to the adder, and the output of the adder connects one or more cascaded frequency shifters, which shift the center frequency of the output of the adder to transmitting carrier frequencies; or
each output of the pre-distortion module is connected to one or more cascaded frequency shifters, which shift the center frequency of the output of each pre-distortion function to an intermediary frequency finally, and the outputs of the frequency shifters are connected to the adder, and the output of the adder is connected to one or more cascaded frequency shifters, which shift the center frequency of the output of the adder to transmitting carrier frequencies; or
F outputs of the pre-distortion module are connected to one or more cascaded frequency shifters, which shift the center frequency of the output of the pre-distortion function to an intermediary frequency finally, F equal to the number of baseband input signals minus 1, and the outputs of the frequency shifters are connected to the adder, and output of the adder is connected to one or more cascaded frequency shifters, which shift the center frequency of the output of the adder to transmitting carrier frequencies.

4. The pre-distorter as claimed in claim 1, which further comprises:
a bandpass filter, which is configured to connect with an output of the PA, and filter out harmonics of said carrier frequencies introduced by the PA, and transmit the filtered signal;
wherein the cascade of the pre-distortion functions, the PA and the bandpass filter are linear overall.

5. The pre-distorter as claimed in claim 1, wherein the pre-distortion functions are $$PD_i(n) = \sum_{j=0}^{M_i-1}\sum_{k_1=0}^{L_{i,1}-1}\sum_{k_2=0}^{L_{i,2}-1}\ldots\sum_{k_N=0}^{L_{i,N}-1} h_{i,j,k_1,k_2,\ldots,k_N} BB_i(n-j)|BB_1(n-j)|^{k_1}$$
$$|BB_2(n-j)|^{k_2}\ldots|BB_N(n-j)|^{k_N} \quad \text{Eq. 1}$$

wherein i is between 1 and N, and N is equal to the number of the baseband input signals;

$M_i$ represents the memory depth of the PA, $L_{i,1}, L_{i,2}, \ldots, L_{i,N}$ represent the nonlinearity length and the interband crosscorrelation degree of the pre-distortion function, and values used for $M_i, L_{i,1}, L_{i,2}, \ldots,$ and $L_{i,N}$ vary based on the PA;

coefficients $h_{i,j,k_1,k_2,\ldots,k_N}$ are chosen such that the cascade of the MIMO pre-distortion function, and the PA will be linear overall;

$BB_i$ are baseband input signals, and $PD_i$ are the pre-distorted signals.

6. The pre-distorter as claimed in claim 5, wherein the coefficients $h_{i,j,k_1,k_2,\ldots,k_N}$ are obtained by solving:

$$PD_i(n) = \sum_{j=0}^{M_i-1}\sum_{k_1=0}^{L_{i,1}-1}\sum_{k_2=0}^{L_{i,2}-1} \ldots \sum_{k_N=0}^{L_{i,N}-1} \hat{h}_{i,j,k_1,k_2,\ldots,k_N} PO_i(n-j)|PO_1(n-j)|^{k_1}$$
$$|PO_2(n-j)|^{k_2} \ldots |PO_N(n-j)|^{k_N} \quad \text{Eq. 2}$$

wherein $PO_i$ are captured signals of the pre-distorted signals, which are captured from the output of the PA.

7. The pre-distorter as claimed in claim 6, which further comprises:

a plurality of bandpass filters, which are configured to filter a signal output from the PA, wherein the number of the bandpass filters is equal to the number of the baseband input signals;

a plurality of frequency shifters, which are configured to shift the output signals of each bandpass filter respectively to obtain captured signals $PO_i$, wherein the center frequency of each frequency shifted signal is zero, and the number of the bandpass filters is equal to the number of the baseband input signals;

a capture buffer, which is configured to obtain $PD_i$ and $PO_i$, and output the obtained $PD_i$ and $PO_i$ to a digital data processor (DSP), and the number of inputs of the capture buffer equals to twice of the number of the baseband input signals; and a DSP, which is configured to calculate coefficients $h_{i,j,k_1,k_2,\ldots,k_N}$ by solving equation Eq.2, and output the calculated coefficients $h_{i,j,k_1,k_2,\ldots,k_N}$ to the pre-distortion module.

8. The pre-distorter as claimed in claim 7, wherein the DSP is configured to use least squares minimization $\vec{h}_i = (H_i^H H_i)^{-1} H_i^H \vec{p}_{di}$ to solve the Eq.2 to obtain the values of $h_{i,j,k_1,k_2,\ldots,k_N}$, wherein $$\vec{p}_{di} = \begin{bmatrix} PD_i(1) \\ PD_i(2) \\ \ldots \end{bmatrix},$$

$$\vec{h}_i = \begin{bmatrix} \hat{h}_{i,0,0,\ldots,0,0} \\ \ldots \\ \hat{h}_{i,0,0,\ldots,0,L_{i,N}-1} \\ \hat{h}_{i,0,0,\ldots,1,0} \\ \ldots \\ \hat{h}_{i,0,0,\ldots,1,L_{i,N}-1} \\ \ldots \\ \hat{h}_{i,0,0,\ldots,L_{i,N-1}-1,0} \\ \ldots \\ \hat{h}_{i,0,0,\ldots,L_{i,N-1}-1,L_{i,N}-1} \\ \hat{h}_{i,1,0,\ldots,0,0} \\ \ldots \\ \hat{h}_{i,M_i-1,L_{i,1}-1,\ldots,L_{i,N-1}-1,L_{i,N}-1} \end{bmatrix},$$

$H_i$ is a matrix, and elements in the matrix are expressed as $PO_i(n-j)|PO_1(n-j)|^{k_1}|PO_2(n-j)|^{k_2}\ldots|PO_i(n-j)|^{k_i}\ldots|PO_N(n-j)|^{k_N}$, and row n in the matrix is expressed as:

$$\begin{bmatrix} PO_i(n-0)|PO_1(n-0)|^0|PO_2(n-0)|^0 \ldots |PO_{N-1}(n-0)|^0|PO_N(n-0)|^0 \\ PO_i(n-0)|PO_1(n-0)|^0|PO_2(n-0)|^0 \ldots |PO_{N-1}(n-0)|^0|PO_N(n-0)|^1 \\ \ldots \\ PO_i(n-0)|PO_1(n-0)|^0|PO_2(n-0)|^0 \ldots |PO_{N-1}(n-0)|^0|PO_N(n-0)|^{L_{i,N}-1} \\ PO_i(n-0)|PO_1(n-0)|^0|PO_2(n-0)|^0 \ldots |PO_{N-1}(n-0)|^1|PO_N(n-0)|^0 \\ PO_i(n-0)|PO_1(n-0)|^0|PO_2(n-0)|^0 \ldots |PO_{N-1}(n-0)|^1|PO_N(n-0)|^1 \\ \ldots \\ PO_i(n-0)|PO_1(n-0)|^0|PO_2(n-0)|^0 \ldots |PO_{N-1}(n-0)|^1|PO_N(n-0)|^{L_{i,N}-1} \\ PO_i(n-0)|PO_1(n-0)|^0|PO_2(n-0)|^0 \ldots |PO_{N-1}(n-0)|^2|PO_N(n-0)|^0 \\ PO_i(n-0)|PO_1(n-0)|^0|PO_2(n-0)|^0 \ldots |PO_{N-1}(n-0)|^2|PO_N(n-0)|^1 \\ \ldots \\ PO_i(n-0)|PO_1(n-0)|^{L_{i,1}-1}|PO_2(n-0)|^{L_{i,2}-1} \ldots |PO_{N-1}(n-0)|^{L_{i,N-1}-1}|PO_N(n-0)|^{L_{i,N}-1} \\ PO_i(n-1)|PO_1(n-1)|^0|PO_2(n-1)|^0 \ldots |PO_{N-1}(n-1)|^0|PO_N(n-1)|^0 \\ \ldots \\ PO_i(n-1)|PO_1(n-1)|^{L_{i,1}-1}|PO_2(n-1)|^{L_{i,2}-1} \ldots |PO_{N-1}(n-1)|^{L_{i,N-1}-1}|PO_N(n-1)|^{L_{i,N}-1} \\ PO_i(n-2)|PO_1(n-2)|^0|PO_2(n-2)|^0 \ldots |PO_{N-1}(n-2)|^0|PO_N(n-2)|^0 \\ \ldots \\ PO_i(n-M_i)|PO_1(n-M_i)|^{L_{i,1}-1}|PO_2(n-M_i)|^{L_{i,2}-1} \ldots |PO_{N-1}(n-M_i)|^{L_{i,N-1}-1}|PO_N(n-M_i)|^{L_{i,N}-1} \end{bmatrix}^T .$$

9. A method for pre-distorting, the method comprising:
a plurality of baseband input signals being pre-distorted by an equal number of pre-distortion functions to obtain an equal number of pre-distorted signals respectively, wherein the number of the inputs of each pre-distortion function is equal to the number of the plurality of baseband input signals, and all of the plurality of baseband input signals are input into each of the pre-distortion functions, and each of the pre-distortion functions has one output which is dependent on all of the inputs of the pre-distortion function;
the pre-distorted signal of each pre-distortion function being frequency shifted, wherein a center frequency of the pre-distorted signal of each pre-distortion function is shifted to a transmitting carrier frequency;
the frequency-shifted signals being combined into one signal; and
the combined signal being amplified by a power amplifier (PA),
wherein the cascade of the pre-distortion functions and the PA are linear overall.

10. The method as claimed in claim 9, after the step of the combined signal being power amplified by a PA, the method further comprising:
the output signal of the PA passing through a bandpass filter which filters out harmonics of said carrier frequencies introduced by the PA,
and the bandpass filter transmitting the filtered signal;
wherein the cascade of the pre-distortion functions, the PA and the bandpass filter are linear overall.

11. The method as claimed in claim 9, wherein in the step of a plurality of baseband input signals being pre-distorted by an equal number of pre-distortion functions, the pre-distortion functions are $$PD_i(n) = \sum_{j=0}^{M_i-1}\sum_{k_1=0}^{L_{i,1}-1}\sum_{k_2=0}^{L_{i,2}-1}\cdots\sum_{k_N=0}^{L_{i,N}-1} h_{i,j,k_1,k_2,\ldots,k_N} BB_i(n-j)|BB_1(n-j)|^{k_1}$$
$$|BB_2(n-j)|^{k_2} \ldots |BB_N(n-j)|^{k_N} \quad \text{Eq. 3}$$

wherein
i is between 1 and N, and N is equal to the number of the baseband input signals;
$M_i$ represents the memory depth of the PA, $L_{i,1}$, $L_{i,2}$, ..., $L_{i,N}$ represent the nonlinearity length and the interband crosscorrelation degree of the pre-distortion function, and values used for $M_i$, $L_{i,1}$, $L_{i,2}$, ..., and $L_{i,N}$ vary based on the PA;
coefficients $h_{i,j,k_1,k_2,\ldots,k_N}$ are chosen such that the cascade of the MIMO pre-distortion function, and the PA will be linear overall;
$BB_i$ are baseband input signals, and $PD_i$ are the pre-distorted signals.

12. The method as claimed in claim 11, wherein the coefficients $h_{i,j,k_1,k_2,\ldots,k_N}$ are obtained by solving:

$$PD_i(n) = \sum_{j=0}^{M_i-1}\sum_{k_1=0}^{L_{i,1}-1}\sum_{k_2=0}^{L_{i,2}-1}\cdots\sum_{k_N=0}^{L_{i,N}-1} \hat{h}_{i,j,k_1,k_2,\ldots,k_N} PO_i(n-j)|PO_1(n-j)|^{k_1}$$
$$|PO_2(n-j)|^{k_2} \ldots |PO_N(n-j)|^{k_N} \quad \text{Eq. 4}$$

wherein $PO_i$ are captured signals of the pre-distorted signals, which are captured from the output of the PA.

13. The method as claimed in claim 12, wherein a way of obtaining the captured signals of the pre-distorted signals comprises:
a plurality of bandpass filters filtering a signal output from the PA, wherein the number of the bandpass filters is equal to the number of the baseband input signals; and
frequency shifting the output signals of each bandpass filter respectively to obtain captured signals $PO_i$, wherein the center frequency of each frequency shifted signal is zero.

14. The method as claimed in claim 12, wherein least squares minimization $\vec{h}_i = (H_i^H H_i)^{-1} H_i^H \vec{p}_{di}$ are used to solve the Eq.4 to obtain the values of $\hat{h}_{i,j,k_1,k_2,\ldots,k_N}$,
wherein $$\vec{p}_{di} = \begin{bmatrix} PD_i(1) \\ PD_i(2) \\ \cdots \end{bmatrix},$$

$$\vec{h}_i = \begin{bmatrix} \hat{h}_{i,0,0,\ldots,0,0} \\ \cdots \\ \hat{h}_{i,0,0,\ldots,0,L_{i,N}-1} \\ \hat{h}_{i,0,0,\ldots,1,0} \\ \cdots \\ \hat{h}_{i,0,0,\ldots,1,L_{i,N}-1} \\ \cdots \\ \hat{h}_{i,0,0,\ldots,L_{i,N-1}-1,0} \\ \cdots \\ \hat{h}_{i,0,0,\ldots,L_{i,N-1}-1,L_{i,N}-1} \\ \cdots \\ \hat{h}_{i,1,0,\ldots,0,0} \\ \cdots \\ \hat{h}_{i,M_i-1,L_{i,1}-1,\ldots,L_{i,N-1}-1,L_{i,N}-1} \end{bmatrix},$$

$H_i$ is a matrix, and elements in the matrix are expressed as $PO_i(n-j)|PO_1(n-j)|^{k_1}|PO_1(n-j)|^{k_2} \ldots |PO_i(n-j)|^{k_i} \ldots |PO_N(n-j)|^{k_N}$, and row n in the matrix is expressed as:

$$\begin{bmatrix} PO_i(n-0)|PO_1(n-0)|^0|PO_2(n-0)|^0 \ldots |PO_{N-1}(n-0)|^0|PO_N(n-0)|^0 \\ PO_i(n-0)|PO_1(n-0)|^0|PO_2(n-0)|^0 \ldots |PO_{N-1}(n-0)|^0|PO_N(n-0)|^1 \\ \ldots \\ PO_i(n-0)|PO_1(n-0)|^0|PO_2(n-0)|^0 \ldots |PO_{N-1}(n-0)|^0|PO_N(n-0)|^{L_{i,N}-1} \\ PO_i(n-0)|PO_1(n-0)|^0|PO_2(n-0)|^0 \ldots |PO_{N-1}(n-0)|^1|PO_N(n-0)|^0 \\ PO_i(n-0)|PO_1(n-0)|^0|PO_2(n-0)|^0 \ldots |PO_{N-1}(n-0)|^1|PO_N(n-0)|^1 \\ \ldots \\ PO_i(n-0)|PO_1(n-0)|^0|PO_2(n-0)|^0 \ldots |PO_{N-1}(n-0)|^1|PO_N(n-0)|^{L_{i,N}-1} \\ PO_i(n-0)|PO_1(n-0)|^0|PO_2(n-0)|^0 \ldots |PO_{N-1}(n-0)|^2|PO_N(n-0)|^0 \\ PO_i(n-0)|PO_1(n-0)|^0|PO_2(n-0)|^0 \ldots |PO_{N-1}(n-0)|^2|PO_N(n-0)|^1 \\ \ldots \\ PO_i(n-0)|PO_1(n-0)|^{L_{i,1}-1}|PO_2(n-0)|^{L_{i,2}-1} \ldots |PO_{N-1}(n-0)|^{L_{i,N-1}-1}|PO_N(n-0)|^{L_{i,N}-1} \\ PO_i(n-1)|PO_1(n-1)|^0|PO_2(n-1)|^0 \ldots |PO_{N-1}(n-1)|^0|PO_N(n-1)|^0 \\ \ldots \\ PO_i(n-1)|PO_1(n-1)|^{L_{i,1}-1}|PO_2(n-1)|^{L_{i,2}-1} \ldots |PO_{N-1}(n-1)|^{L_{i,N-1}-1}|PO_N(n-1)|^{L_{i,N}-1} \\ PO_i(n-2)|PO_1(n-2)|^0|PO_2(n-2)|^0 \ldots |PO_{N-1}(n-2)|^0|PO_N(n-2)|^0 \\ \ldots \\ PO_i(n-M_i)|PO_1(n-M_i)|^{L_{i,1}-1}|PO_2(n-M_i)|^{L_{i,2}-1} \ldots |PO_{N-1}(n-M_i)|^{L_{i,N-1}-1}|PO_N(n-M_i)|^{L_{i,N}-1} \end{bmatrix}^T.$$

15. The method as claimed in claim 14, wherein in the step of a plurality of baseband input signals being pre-distorted by an equal number of pre-distortion functions, initially, $h_{i,0,0,0,\ldots,0}$ are set to 1 and all other values for $h_{i,j,k_1,k_2,\ldots,k_N}$ are set to zero;

and when coefficients $h_{i,j,k_1,k_1,\ldots,k_N}$ are obtained by solving the Eq.4, the method further comprises:

updating with the obtained $h_{i,j,k_1,k_2,\ldots,k_N}$.

16. The method as claimed in claim 15, the method further comprising:

recalculating coefficients $h_{i,j,k_1,k_2,\ldots,k_N}$ by solving equation Eq.4 at a plurality of times or at a period; and updating old coefficients $h_{i,j,k_1,k_2,\ldots,k_N}$ with the recalculated coefficients $h_{i,j,k_1,k_2,\ldots,k_N}$.

17. The pre-distorter as claimed in claim 4, wherein the pre-distortion functions are $$PD_i(n) = \sum_{j=0}^{M_i-1} \sum_{k_1=0}^{L_{i,1}-1} \sum_{k_2=0}^{L_{i,2}-1} \ldots \sum_{k_N=0}^{L_{i,N}-1} h_{i,j,k_1,k_2,\ldots,k_N} BB_i(n-j)|BB_1(n-j)|^{k_1} |BB_2(n-j)|^{k_2} \ldots |BB_N(n-j)|^{k_N} \quad \text{Eq. 1}$$

wherein i is between 1 and N, and N is equal to the number of the baseband input signals;

$M_i$ represents the memory depth of the PA, $L_{i,1}, L_{i,2}, \ldots, L_{i,N}$ represent the nonlinearity length and the interband crosscorrelation degree of the pre-distortion function, and values used for $M_i, L_{i,1}, L_{i,2}, \ldots,$ and $L_{i,N}$ vary based on the PA;

coefficients $h_{i,j,k_1,k_2,\ldots,k_N}$ are chosen such that the cascade of the MIMO pre-distortion function, and the PA will be linear overall;

$BB_i$ are baseband input signals, and $PD_i$ are the pre-distorted signals.

18. The pre-distorter as claimed in claim 17, wherein the coefficients $h_{i,j,k_1,k_2,\ldots,k_N}$ are obtained by solving:

$$PD_i(n) = \sum_{j=0}^{M_i-1} \sum_{k_1=0}^{L_{i,1}-1} \sum_{k_2=0}^{L_{i,2}-1} \ldots \sum_{k_N=0}^{L_{i,N}-1} \hat{h}_{i,j,k_1,k_2,\ldots,k_N} PO_i(n-j)|PO_1(n-j)|^{k_1} |PO_2(n-j)|^{k_2} \ldots |PO_N(n-j)|^{k_N} \quad \text{Eq. 2}$$

wherein $PO_i$ are captured signals of the pre-distorted signals, which are captured from the output of the PA.

* * * * *